US012805239B2

(12) United States Patent
Lee et al.

(10) Patent No.: US 12,805,239 B2
(45) Date of Patent: Nov. 17, 2026

(54) SUBSTRATE PROCESSING APPARATUS

(71) Applicant: WONIK IPS CO., LTD., Pyeongtaek-si Gyeonggi-do (KR)

(72) Inventors: Seung Seob Lee, Seoul (KR); Jeong Lim Son, Sejong-si (KR); Joo Ho Kim, Seoul (KR); Kyung Park, Seoul (KR); Joo Suop Kim, Hwaseong-si Gyeonggi-do (KR)

(73) Assignee: WONIK IPS CO., LTD., Pyeongtaek-si Gyeonggi-do (KR)

( * ) Notice: Subject to any disclaimer, the term of this patent is extended or adjusted under 35 U.S.C. 154(b) by 504 days.

(21) Appl. No.: 17/016,134

(22) Filed: Sep. 9, 2020

(65) Prior Publication Data

US 2021/0317575 A1 Oct. 14, 2021

(30) Foreign Application Priority Data

Apr. 14, 2020 (KR) ........................ 10-2020-0045298
Apr. 14, 2020 (KR) ........................ 10-2020-0045299
Apr. 14, 2020 (KR) ........................ 10-2020-0045300
Apr. 14, 2020 (KR) ........................ 10-2020-0045301
Apr. 14, 2020 (KR) ........................ 10-2020-0045303

(51) Int. Cl.
*C23C 16/455* (2006.01)
*C23C 16/34* (2006.01)
(Continued)

(52) U.S. Cl.
CPC ...... *H10P 72/0431* (2026.01); *C23C 16/4412* (2013.01); *H10P 72/0402* (2026.01);
(Continued)

(58) Field of Classification Search
CPC ........... H01L 21/67098; H01L 21/6732; H01L 21/67303; H01L 21/67757
See application file for complete search history.

(56) References Cited

U.S. PATENT DOCUMENTS 5,368,648 A * 11/1994 Sekizuka .......... H01L 21/67126
277/653
5,497,727 A * 3/1996 Mayeda ................ F16L 23/036
118/733
(Continued)

FOREIGN PATENT DOCUMENTS

JP H01106423 A 4/1989
JP H07045546 A 2/1995
(Continued)

*Primary Examiner* — Parviz Hassanzadeh
*Assistant Examiner* — Nathan K Ford
(74) *Attorney, Agent, or Firm* — WILLIAM PARK AND ASSOCIATES LTD.

(57) ABSTRACT

The present invention relates to a substrate processing apparatus, and more particularly, to a substrate processing apparatus in which a substrate is processed at a high pressure and a low pressure. The substrate processing apparatus includes an outer tube which defines a protective space therein and has a lower portion in which a first inlet is provided and an inner tube which defines a reaction space therein and has a lower portion in which a second inlet is provided, wherein a portion of the inner tube is accommodated in the outer tube, and the portion, in which the second inlet is provided, protrudes downward from the outer tube.

24 Claims, 15 Drawing Sheets

(51) Int. Cl.

| | |
|---|---|
| ***C23C 16/44*** | (2006.01) |
| ***C23C 16/458*** | (2006.01) |
| ***H01L 21/67*** | (2006.01) |
| ***H01L 21/673*** | (2006.01) |
| ***H10P 72/00*** | (2026.01) |
| *B05B 1/32* | (2006.01) |
| *B05B 11/00* | (2023.01) |
| *H10P 72/10* | (2026.01) |
| *H10P 72/30* | (2026.01) |

(52) U.S. Cl.

CPC ........... *B05B 1/323* (2013.01); *B05B 11/0037* (2013.01); *B05B 11/0039* (2018.08); *C23C 16/34* (2013.01); *C23C 16/455* (2013.01); *C23C 16/4584* (2013.01); *H10P 72/0602* (2026.01); *H10P 72/12* (2026.01); *H10P 72/3312* (2026.01)

(56) References Cited

U.S. PATENT DOCUMENTS

| | | | | | |
|---|---|---|---|---|---|
| 5,622,639 | A * | 4/1997 | Kitayama | C23C 16/46 | 219/400 |
| 6,187,102 | B1 * | 2/2001 | Yamamoto | C23C 16/4401 | 118/725 |
| 2007/0080156 | A1 * | 4/2007 | Seo | H01L 21/67757 | 219/383 |
| 2008/0090195 | A1 * | 4/2008 | Takahashi | F27B 17/0025 | 110/173 R |
| 2010/0297832 | A1 * | 11/2010 | Imai | C23C 16/4401 | 427/249.15 |
| 2012/0052457 | A1 * | 3/2012 | Saito | C30B 29/06 | 432/206 |
| 2016/0069613 | A1 * | 3/2016 | Colgan | H01L 21/67303 | 438/795 |

FOREIGN PATENT DOCUMENTS

| | | | | |
|---|---|---|---|---|
| JP | 2001267255 | A | 9/2001 | |
| JP | 2002353153 | A | 12/2002 | |
| JP | 2009059872 | A | 3/2009 | |
| KR | 1020200006422 | A | 1/2020 | |
| KR | 10-2020-0029895 | * | 3/2020 | H01L 21/67 |
| KR | 1020200029895 | A | 3/2020 | |
| KR | 1020200031798 | A | 3/2020 | |
| TW | 201901833 | A | 1/2019 | |
| TW | 201930641 | A | 8/2019 | |

* cited by examiner

SUBSTRATE PROCESSING APPARATUS

CROSS-REFERENCE TO RELATED APPLICATIONS

This U.S. non-provisional patent application claims priority under 35 U.S.C. § 119 of Korean Patent Application Nos. 10-2020-0045298, filed on Apr. 14, 2020, 10-2020-0045299, filed on Apr. 14, 2020, 10-2020-0045300, filed on Apr. 14, 2020, 10-2020-0045301, filed on Apr. 14, 2020, 10-2020-0045303, filed on Apr. 14, 2020, the entire contents of which are hereby incorporated by reference.

FIELD OF THE INVENTION

The present invention relates to a substrate processing apparatus, and more particularly, to a substrate processing apparatus in which a substrate is processed at a high pressure and a low pressure.

BACKGROUND ART

A substrate processing apparatus may be understood as processing a semiconductor process for a substrate such as a wafer. As an example of the substrate processing apparatus, a reactor using a boat for heat processing of the substrate may be used.

The reactor is configured to allow the boat loading substrates in a unit of predetermined sheets (for example, 180 sheets) to be elevated in a loading region so as to thermally process the substrates or allow the boat to descend to the loading region so as to unload the thermally processed substrates.

The reactor is configured to be provided with a tube that accommodates the elevated boat, thereby forming a reaction space blocked from the outside. In general, in order to efficiently perform the thermal processing process, the tube is made of a quartz material having good heat transfer properties.

The above-described tube may be damaged when an internal temperature and pressure are significantly different from an external temperature and pressure due to the material properties. The damage of the tube may deteriorate reliability of the substrate processing apparatus itself and also entire process yield.

Therefore, the substrate processing apparatus needs to be designed to adopt a technology that is capable of ensuring the product reliability and improving the process yield.

In addition, the substrate processing apparatus is used to supply a source gas, a reaction gas, a carrier gas, and the like and apply an appropriate temperature and pressure so as to form a thin film having a desired thickness on a substrate.

Also, in the process of forming the thin film, there is a limitation of deteriorating the yield due to residues inside the thin film or on a surface of the thin film.

Therefore, it is required to develop a technology for preprocessing, in-processing, and post-processing the residues, and development of a substrate processing apparatus for effectively applying the developed technology is also required.

SUMMARY OF THE INVENTION

To solve the above-mentioned limitations, the present invention provides a substrate processing apparatus that is capable of minimizing various incompletenesses that exist in a thin film before, during, or after formation of a thin film on a substrate.

The present invention also provides a substrate processing apparatus which performs a high-pressure process, in which a reaction space has a high pressure greater than atmospheric pressure, and a low-pressure process, in which the reaction space has a low pressure less than the atmospheric pressure, in order to improve yield of a thin film of the substrate.

The present invention also provides a substrate processing apparatus in which a reaction tube is configured to include an inner tube, in which a process is performed, and an outer tube controlling a pressure outside the inner tube and thereby to easily control a change in pressure of the reaction tube during process processing so as to control the change in pressure.

The present invention also provides a substrate processing apparatus in which a pressure between an outer tube and an inner tube is maintained higher than that of a reaction space of the inner tube during a process of processing a substrate to limit an extent of damage to the inside of the outer tube even when the inner tube is damaged.

The present invention also provides a substrate processing apparatus in which an inner tube and an outer tube are formed to have a dome-shaped ceiling to secure structural stability of the inner tube and the outer tube and generate a vortex inside the inner tube or prevent an air flow from being partially stagnated.

The present invention also provides a substrate processing apparatus in which an inner manifold and an outer manifold, which correspond to an inner tube and an outer tube, are provided to supply or exhaust a gas into/from the inner tube and the outer tube and secure design and assembly convenience.

The present invention also provides a substrate processing apparatus that is capable of preventing leakage from occurring between an inner manifold and a cap flange when a high pressure is generated in a reaction space during a process of processing a substrate.

The present invention also provides a substrate processing apparatus that is capable of sensing a temperature of an entire reaction space by a vertical cylindrical inner tube having a dome-shaped ceiling.

In accordance with an embodiment of the present invention, a substrate processing apparatus includes: an outer tube which defines a protective space therein and has a lower portion in which a first inlet is provided; an inner tube which defines a reaction space therein and has a lower portion in which a second inlet is provided, wherein a portion of the inner tube is accommodated in the outer tube, and the portion, in which the second inlet is provided, protrudes downward from the outer tube; a manifold assembly configured to support the outer tube, which is disposed at an upper side, and the inner tube, which is disposed at a lower side, in a state in which the outer tube and the inner tube are spaced apart from each other; and a cap flange configured to seal a lower portion of the manifold assembly.

The outer tube may be made of a metal material, and the inner tube may be made of a non-metal material.

The outer tube and the inner tube may be made of a non-metal material.

The outer tube may have a vertical cylindrical shape with a first dome-shaped ceiling, and the inner tube may have a vertical cylindrical shape with a second dome-shaped ceiling.

The manifold assembly may include: an outer manifold configured to support a lower end of the outer tube and define a first inner space connected to the protective space; and an inner manifold coupled to a lower portion of the outer manifold to support a lower end of the inner tube and defining a second inner space connected to the reaction space.

The outer manifold may include: a first sidewall defining the first inner space; a first upper flange extending outward from a circumference of an upper portion of the first sidewall to support the lower end of the outer tube; and a first lower flange extending outward from a circumference of a lower portion of the first sidewall and coupled to the inner manifold, the first lower flange being provided with a plurality of coupling parts on which coupling members are coupled along the circumference, wherein the inner manifold may include: a second sidewall defining the second inner space; a second upper flange extending outward from a circumference of an upper portion of the second sidewall and coupled to the inner manifold, the second upper flange being provided with a plurality of second coupling parts on which the coupling members are coupled along the circumference; a second lower flange extending outward from a circumference of a lower portion of the second sidewall, wherein the first lower flange and the second upper flange may be coupled to each other by the coupling members.

The first sidewall of the outer manifold may have an inner diameter greater than that of the second sidewall of the inner manifold.

The outer manifold may be provided with an outer gas supply port through which an inert gas is supplied and an outer gas exhaust port through which the inert gas is exhausted.

The outer manifold may be provided with an outer pumping port connected to an external vacuum pump so that the protective space has a low pressure lower than atmospheric pressure.

The inner manifold may be provided with an inner gas supply port configured to supply a process gas and an inner gas exhaust port configured to exhaust the process gas.

The inner manifold may be provided with an inner pumping port connected to an external vacuum pump so that the reaction space has a low pressure lower than atmospheric pressure.

In the inner manifold, a thermocouple coupler to which a thermocouple protection tube, in which a thermocouple configured to measure a temperature of the reaction space is installed, may be coupled is disposed on the second sidewall.

The substrate processing apparatus may further include: a plurality of clamping modules disposed at positions that are dispersed on a side surface of the cap flange; and an inner pumping part configured to perform pumping with respect to the reaction space through the manifold assembly, wherein a top surface of the cap flange may be close to a bottom surface of the manifold assembly by a first spaced interval with an O-ring therebetween by elevation of the cap flange, wherein the reaction space may be depressurized to a pressure less than atmospheric pressure by the pumping of the inner pumping part, the top surface of the cap flange may be adjacent to the bottom surface of the manifold assembly by a second spaced interval less than the first spaced interval with the O-ring therebetween, and the plurality of clamping modules may be configured to clamp the cap flange adjacent by the second spaced interval with a lower portion of the manifold assembly.

The substrate processing apparatus may further include a base plate fixed to be spaced apart from the lower portion of the cap flange, wherein the plurality of clamping modules may be provided with clamps which are installed to be dispersed on the base plate and in which a clamping channel facing a side surface of the cap flange is provided, respectively, and as the clamps are driven, the cap flange adjacent by the second spaced interval and a lower portion of the manifold assembly may be clamped inside the clamping channel.

Each of the clamping modules may include: the clamp in which the clamping channel facing the side surface of the cap flange is provided; a clamp bracket configured to vertically support the clamp; an actuator fixed to the base plate, connected to the clamp bracket through a rod, and allowing the clamp bracket and the clamp to move forward and backward, wherein the clamp may move between a locking position for the clamping and a releasing position for releasing the clamping by the driving of the actuator.

The substrate processing apparatus may further include an elevating plate, which is maintained to be spaced apart from the base plate by elastic force of an elastic part, under the base plate, wherein the elastic part may be disposed between the base plate and the elevating plate and provides the elastic force so that a top surface of the cap flange and a bottom surface of the manifold assembly are close by the first spaced interval.

The elastic part may include a spring disposed at a plurality of positions between the elevating plate and the base plate.

The manifold assembly may include: an outer manifold configured to support a lower portion of the outer tube and define a first inner space connected to the protective space; and an inner manifold configured to support a lower portion of the inner tube and define a second inner space connected to the reaction space, wherein the inner manifold may include a second lower flange constituting a portion of the manifold assembly and facing a top surface of a side portion of the cap flange, and the plurality of clamp modules may be configured to clamp the cap flange and the second lower flange, which are adjacent to each other by the second spaced interval, through the O-ring.

The substrate processing apparatus may further include a thermocouple protection tube which is installed vertically in the reaction space, of which a lower portion is drawn out through the inner manifold, and into which a plurality of thermocouples including detection parts configured to sense temperatures at different positions within the reaction space are inserted, wherein the reaction space may be divided into a ceiling region defined by the second dome-shaped ceiling and a reaction region defined under the ceiling region, the thermocouple protection tube may include may include an extension tube extending to the ceiling region and having a bent upper portion, and the detection part of at least one thermocouple may be disposed inside the extension tube.

The thermocouple protection tube may include the extension tube disposed at an upper side, a vertical tube disposed under the extension tube, and a lower tube bent from the vertical tube to pass through a sidewall of the inner manifold so as to be drawn to the outside, and the extension tube, the vertical tube, and the lower tube may be integrated with each other.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF THE PREFERRED EMBODIMENTS

Hereinafter, a substrate processing apparatus according to the present invention will be described with reference to the accompanying drawings.

Figure 1:
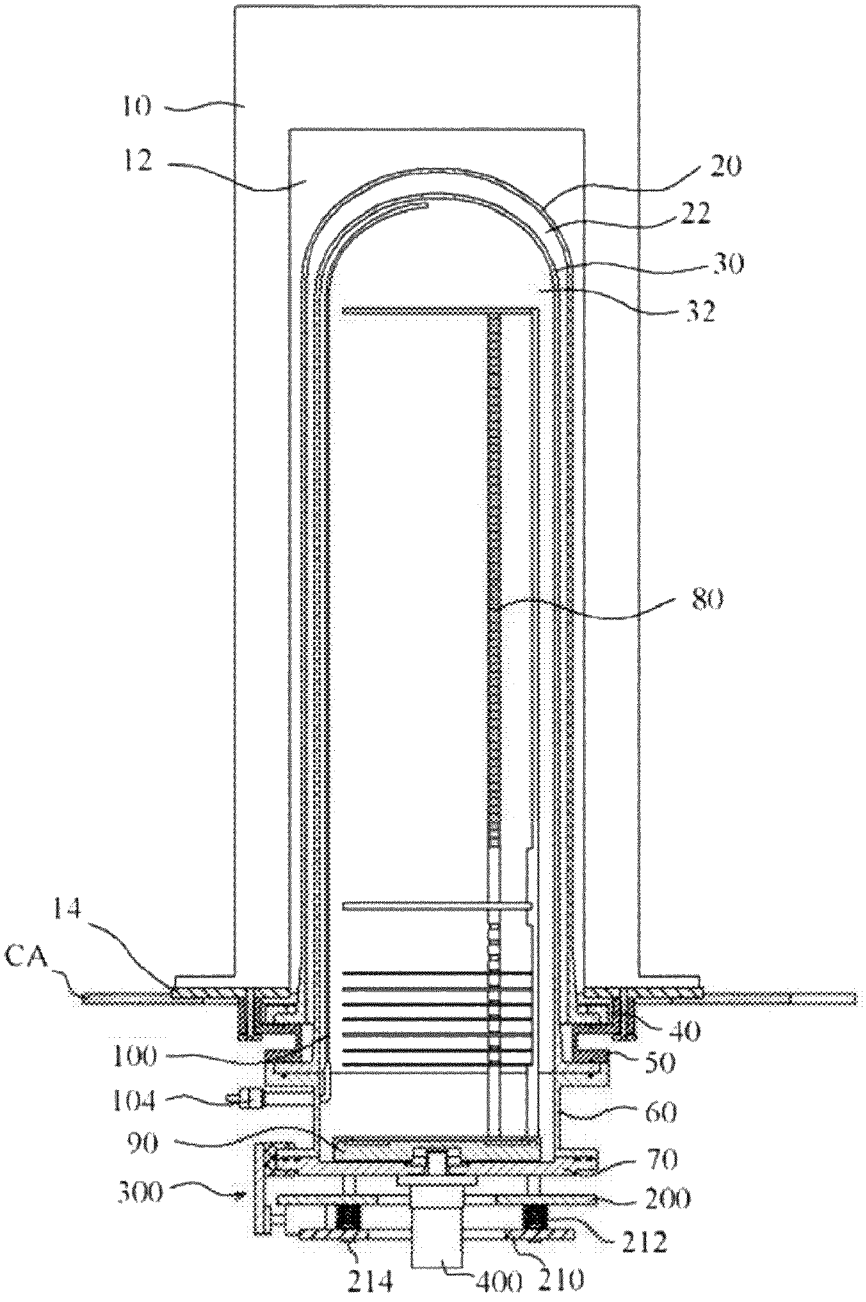
FIG. 1 is a cross-sectional view illustrating a configuration at a first position of a substrate processing apparatus according to the present invention.

As illustrated in FIG. 1, a substrate processing apparatus according to the present invention includes an outer tube 20 defining a protective space 22 therein and including a first inlet at a lower portion thereof, an inner tube 30 defining a reaction space 32 therein and including a second inlet at a lower portion thereof, wherein a portion of the inner tube 30 is accommodated in the outer tube 20, and a portion at which the second inlet is provided protrudes downward of the outer tube 20, a manifold assembly supporting the outer tube 30, which is disposed at an upper side thereof, and the inner tube 20, which is disposed at a lower side thereof, so that the outer tube 30 and the inner tube 20 are spaced apart from each other, and a cap flange 70 sealing a lower portion of the manifold assembly.

The present invention illustrates a substrate processing apparatus that performs a process of processing a substrate.

The process of processing the substrate by using the substrate processing apparatus may be a process of forming a film on the substrate such as a wafer or an annealing process.

In the substrate processing apparatus according to the present invention, before the thin film is formed, a high-pressure process, in which the reaction space has a pressure higher than atmospheric pressure, and a low-pressure process, in which the reaction space has a pressure lower than the atmospheric pressure, may be performed. For example, after the high-pressure process is performed, the low-pressure process may be performed.

In this case, in the substrate processing apparatus according to the present invention, it may be understood that preprocessing is performed on the substrate through a pressure change process in which the high-pressure process and the low-pressure process are performed.

An incompleteness of the thin film due to impurities or other causes in an interfacial lattice of the substrate may be removed by the above-described preprocessing.

For example, when a surface of the substrate is contaminated by chlorine, the chlorine is in a weakly bonded state with silicon atoms of the substrate.

Here, when the reaction space has an appropriate temperature and an appropriate high-temperature higher than the atmospheric pressure by using hydrogen, the hydrogen having lightweight atoms may be penetrated up to a certain depth from a surface of a silicon lattice structure as well as the surface of the substrate.

Thus, a reduction reaction of the high-pressure hydrogen with the chlorine impurities may be promoted to generate byproducts of the hydrogen chloride, and thus, the high-pressure hydrogen may be separated from the surface of the silicon. Here, the separated byproducts may be discharged to the outside of a reactor or a chamber while a pressure within the chamber is reduced to a low pressure.

Also, since thermal vibration of silicon crystal atoms increases under the high pressure, the impurities that are weakly bonded to silicon surface atoms may be removed by the increasing thermal vibration to promote recrystallization or migration phenomena of the substrate surface, thereby achieving an annealing effect.

The recrystallization may allow molecular bonding between elements forming the thin film to be stronger, thereby preventing the impurities from adhering again to a semiconductor surface even though the impurities still remain.

Also, in the substrate processing apparatus according to the present invention, while the thin film is formed, the high-pressure process, in which the reaction space has a pressure higher than the atmospheric pressure, and the low-pressure process, in which the reaction space has a pressure lower than the atmospheric pressure, may be performed. For example, after the high-pressure process is performed, the low-pressure process may be performed.

In this case, in the substrate processing apparatus according to the present invention, while the thin film is formed, the reaction space may have a high pressure higher than the atmospheric pressure by using an appropriate gas and then have a low pressure lower than the atmospheric pressure to improve properties of the thin film having a predetermined thickness.

For example, in a case of a TiN thin film, when a portion of the thin film is formed, a source gas is exhausted to stop the formation of the thin film. In this state, hydrogen ($H_2$) is injected into the reaction space so that the reaction gas has a high pressure.

At the high pressure, not only the hydrogen molecules may increase in density, but also the movement of hydrogen molecule gases may be faster.

Thus, the reaction between the hydrogen molecules and the residual chlorine (Cl) element having the relatively weak bonding or the chlorine (Cl) element having the relatively strong bonding may be further activated and thus be reduced to hydrogen chloride (HCl) gas, which is advantageous to be exhaust.

Furthermore, the recrystallization of the elements forming the thin film may be promoted under the high-pressure reduction atmosphere to improve quality of the thin film. Particularly, the recrystallization may allow the molecular bonding between the elements forming the thin film to be stronger.

Like the hydrogen molecules that are exemplarily described in this process, the elements introduced into the reaction space for the high pressure may be a gas for discharging byproducts generated by being bonded to the impurities within the thin film so as to remove the impurities.

Next, when the reaction space has a low pressure, the remaining impurities such as chlorine (Cl) are exhausted in a hydrogen chloride (HCl) gas state.

More particularly, when the reaction space is depressurized from the high pressure to the atmospheric pressure, the byproducts that are in a hydrogen chloride (HCl) gas state may move to the surface of the thin film or the outside of the thin film.

More specifically, in the process of depressurizing the reaction space from the high pressure to the atmospheric pressure, the byproducts disposed at a position deep in the thin film may move to the surface of the thin film, and the byproducts relatively adjacent to the thin film may move to the outside of the thin film.

Thereafter, when the reaction space is depressurized from the atmospheric pressure to the low pressure through the forced exhaust, the byproducts that are in the hydrogen chloride (HCl) gas state existing in the chamber may move to the surface of the thin film or the outside of the thin film and thus be discharge to the outside of the chamber, thereby removing the impurities.

As a result, the weak bonding between the various undesirable residues in the TiN thin film and the thin film elements may be broken through the high-pressure process-low pressure process, i.e., the pressure change process, and thus, the broken impurities may be removed more effectively than the existing impurities. In addition, the incompleteness of the crystal structure of the thin film or other organic materials may be more effectively removed to be annealed.

Next, a raw material gas may be introduced into the reaction space to form a remaining thickness of the TiN thin film.

Also, in the substrate processing apparatus according to the present invention, after the thin film is formed, the reaction space may have a high pressure higher than the atmospheric pressure, and then, the reaction space may have a low pressure lower than the atmospheric pressure.

In this case, in the substrate processing apparatus according to the present invention, after the thin film is formed, the properties of the thin film may be improved through the pressure change process. Therefore, the improvement in property may be understood as the above-described examples, and thus, detailed descriptions thereof will be omitted.

Figure 2:
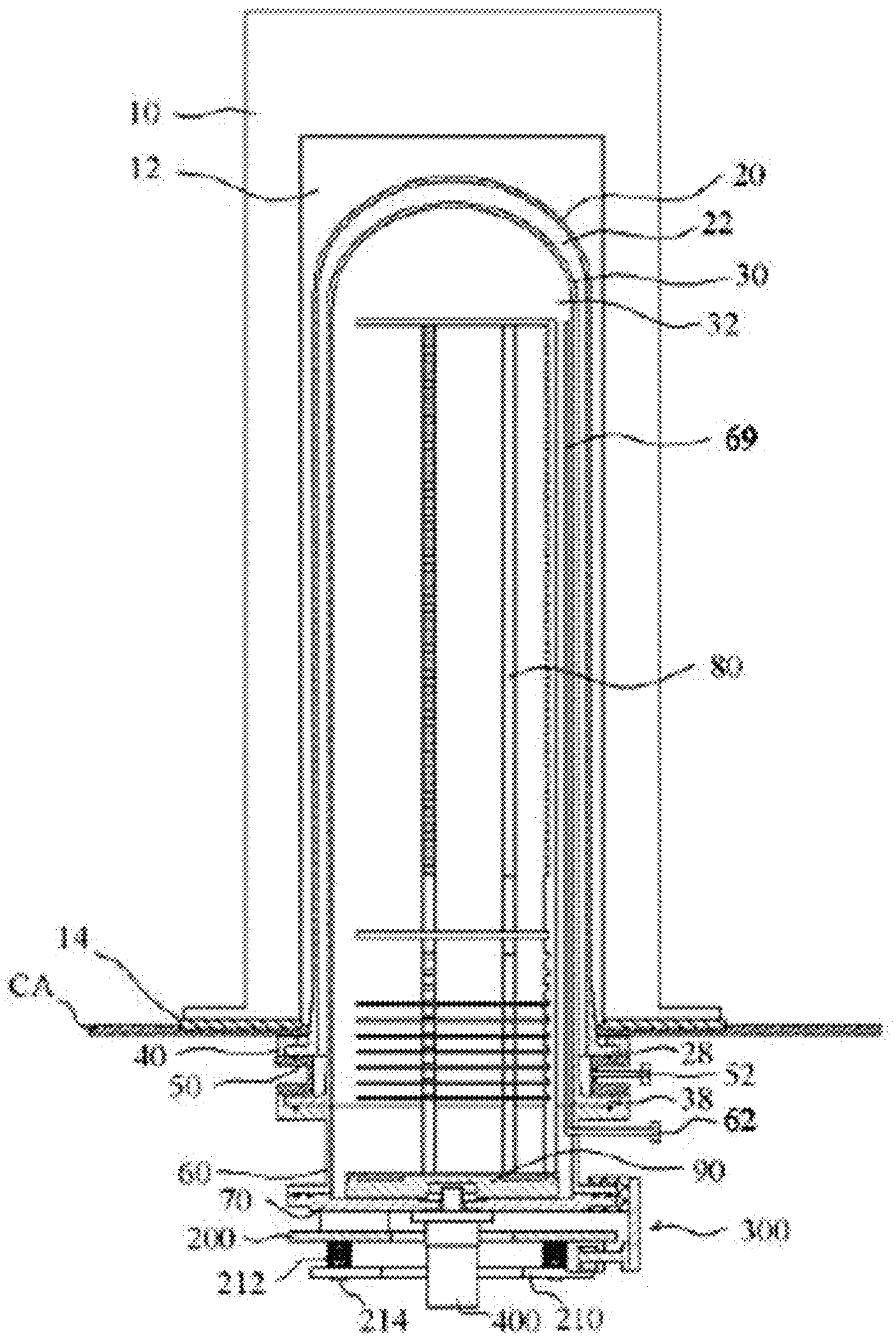
FIG. 2 is a cross-sectional view illustrating a configuration at a second position of the substrate processing apparatus of FIG. 1.

The substrate processing apparatus according to the present invention may be implemented as illustrated in FIGS. 1 and 2 to have a structure capable of performing the pressure change process including the high-pressure process and the low-pressure process, which are described above.

FIGS. 1 and 2 illustrate a reactor as an example of the substrate processing apparatus.

The reactor of FIGS. 1 and 2 is referred to as a substrate processing apparatus for convenience of description.

Figure 3:
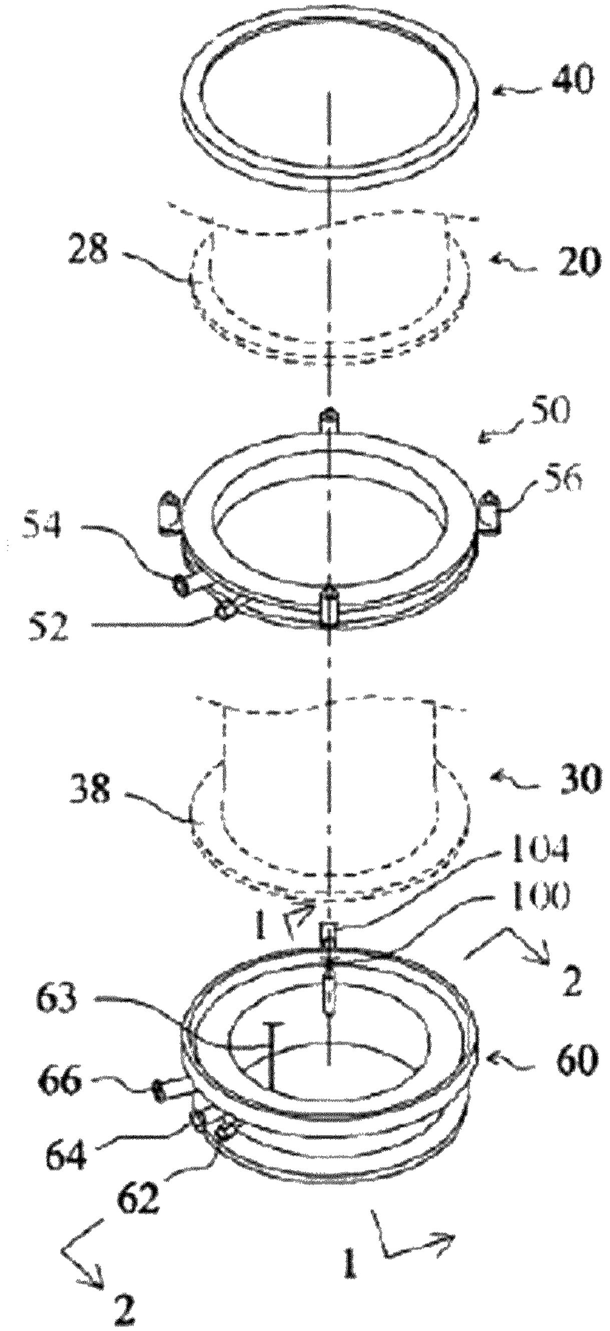
FIG. 3 is an exploded perspective view for explaining constituents of a manifold assembly of the substrate processing apparatus of FIG. 1.

FIG. 1 is a cross-sectional view of a substrate processing apparatus at a first position to show an internal thermocouple protection tube 100 and corresponds to a view taken along line 1-1 of FIG. 3.

Also, FIG. 2 is a cross-sectional view illustrating the substrate processing apparatus at a second position to show the internal thermocouple protection tube 69, FIG. 3 is a view taken along line 2-2.

The substrate processing apparatus is divided into an upper portion in which a heater 10 is provided and a lower portion in which a boat 80 is loaded with respect to a partition wall CA.

The heater 10 is provided above the partition wall CA and has a heating space 12 therein, and the outer tube 20 and the inner tube 30 are accommodated in the heating space 12.

The heating space 12 has an inlet at a lower portion thereof and may have a cylindrical shape with a ceiling blocked in correspondence with shapes of the outer tube 20 and the inner tube 30 accommodated therein.

The partition wall CA has a through-region corresponding to the inlet of the heating space 12.

A heater base 14 having a predetermined thickness may be disposed on a top surface of the partition wall CA to support the heater 10 disposed on the heater base 14.

The heater 10 may be illustrated as including a plurality of heating blocks (not shown) divided by height units, and a heating temperature for each heating block may be independently controlled.

The substrate processing apparatus according to the present invention includes the outer tube 20 and the inner tube 30.

The outer tube 20 is provided in a vertical cylindrical shape having a first dome-shaped ceiling, has a protective space 22 therein, and has a first inlet at a lower portion thereof.

Also, the outer tube 20 has a ring-shaped outer flange 28 extending outward from the first inlet.

Here, the protective space 22 is a space defined between the outer tube 20 and the inner tube 30 and is a space in which a pressure is controlled.

When the reaction space 32 of the inner tube 30 has a pressure equal to or higher than atmospheric pressure, the protective space 22 may have a high pressure that is higher than that of the reaction space 32 by a certain degree.

Also, when the reaction space 32 has a low pressure less than the atmospheric pressure, the protective space 22 may be maintained at the atmospheric pressure or may have a pressure higher than that of the reaction space 32 having the low pressure by a certain degree and lower than the atmospheric pressure.

Thus, the protective space 22 may be understood as a spaced space or a pressure control space, and when the inner tube 30 is damaged, the protective space 22 may serve to prevent a contamination range from being diffused by particles.

The inner tube 30 may be provided in a vertical cylindrical shape having a second dome-shaped ceiling, define the reaction space 32 therein, and have a second inlet at a lower portion thereof.

Also, a portion of the inner tube 30 may be accommodated in the outer tube 20, and a portion in which the second inlet is provided may protrude downward of the outer tube 20.

Furthermore, the inner tube 30 may have a ring-shaped inner flange 38 extending outward from the second inlet.

Here, the outer flange 28 of the outer tube 20 and the inner flange 38 of the inner tube 30 may have the same outer diameter.

The outer tube 20 may be made of a metal material, the inner tube 30 may be made of a non-metal material. For another example, both the outer tube 20 and the inner tube 30 may be made of a non-metal material.

For example, SUS may be used as the metal material, and quartz may be used as the non-metal material.

The outer tube 20 may be configured so that an inner wall of the inner tube 30 and an outer wall of the inner tube 30 are spaced a uniform interval from each other while accommodating a portion of the inner tube 30 therein.

Thus, the outer tube 20 has an inner diameter larger than the outer diameter of a sidewall of the inner tube 30.

That is, the first inlet of the protective space 22 of the outer tube 20 has an inner diameter greater than that of the second inlet of the reaction space 32 of the inner tube 30.

The first dome-shaped ceiling of the outer tube 20 and the second dome-shaped ceiling of the inner tube 30 may be provided in various shapes by a manufacturer to maintain a space occurring by being spaced apart from each other.

For example, the dome-shaped ceilings of the outer tube 20 and the inner tube 30 may be provided in hemispherical shapes having the same curvature.

Thus, when the outer tube 20 and the inner tube 30 are coupled to each other, the protective space 22 may be defined between the outer tube 20 and the inner tube 30.

As described above, an embodiment of the present invention may provide a double tube structure by the outer tube 20 and the inner tube 30.

Therefore, the inner tube 30 may be prevented from being damaged by an environmental difference between an external environment and the internal reaction space 32.

Also, in an embodiment of the present invention, each of the outer tube 20 and the inner tube 30 may be provided to have the dome-shaped ceiling.

Since the dome-shaped structure is capable of effectively dispersing an internal pressure and an external pressure, the outer tube 20 and the inner tube 30 may secure safety against the pressure by the dome-shaped ceiling.

Also, since the dome-shaped ceiling enables air to smoothly flow, the inner tube 30 may have an advantage of preventing a vortex from occurring in the upper portion of the reaction space or preventing an air flow from being partially stagnated.

The inner tube 30 and the outer tube 20, which have a pressure difference therebetween, may prevent byproducts during the process, a processing gas, and particles from being diffused to the outside of the outer tube 20 by the high pressure of the protective space 22 of the outer tube 20 when the inner tube 30 is damaged due to an unspecified reason.

Figure 4:
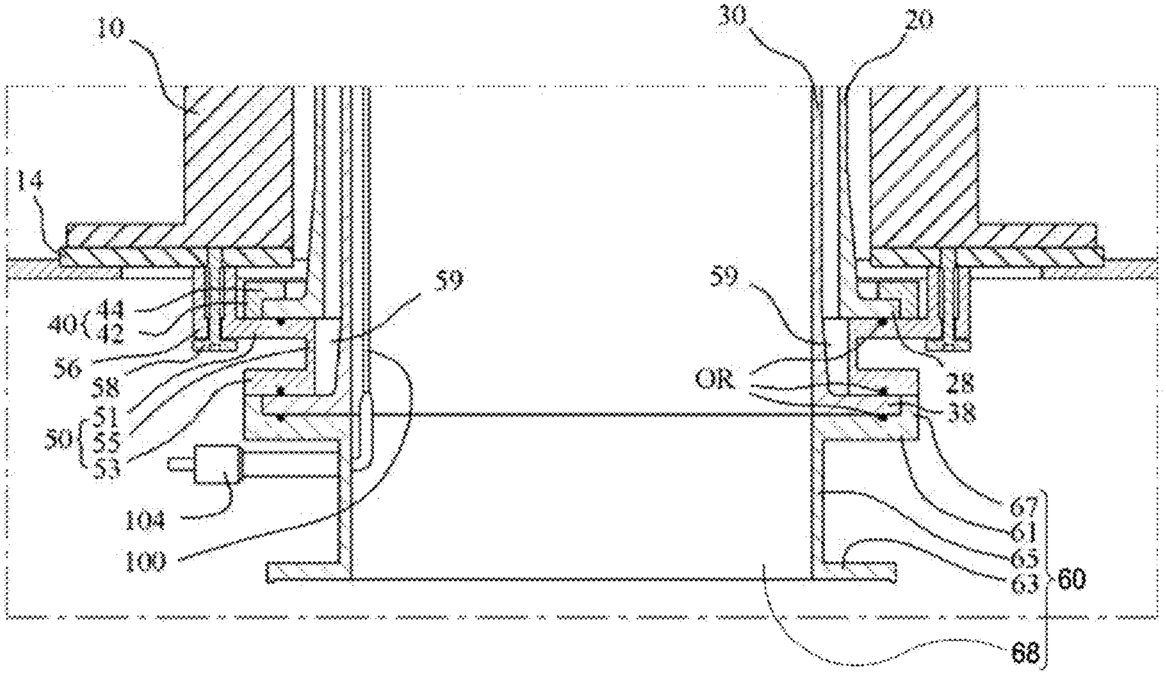
FIG. 4 is a cross-sectional view for explaining an assembly state of the manifold assembly of the substrate processing apparatus of FIG. 1.

As illustrated in FIGS. 3 and 4, the present invention may provide a manifold assembly. The manifold assembly includes a first inner space 59 connected to the protective space 22 at a lower portion of the outer tube 20 and a second inner space 68 connected to the reaction space 32 at a lower portion of the inner tube 30.

In addition, the manifold assembly may support each of the outer tube 20 and the inner tube 30 so that the outer tube 20 and the inner tube 30 are maintained in the state of being spaced apart from each other.

For this, the manifold assembly includes an outer manifold 50, an inner manifold 60, and a ring-shaped cover 40.

Also, a lower portion of the manifold assembly is sealed by a cap flange 70.

The ring-shaped cover 40 covers the outer flange 28 of the outer tube 20 from the top and is configured to be coupled to the outer manifold 50.

Thus, the outer flange 28 is disposed between the ring-shaped cover 40 and the outer manifold 50, which are coupled to each other.

More particularly, the ring-shaped cover 40 may be provided with a plurality of coupling parts capable of coupling a coupling member to a side portion thereof, and the outer manifold 50 may be provided with a plurality of coupling parts capable of coupling a coupling member to a side portion of a first upper flange 51 that will be described later.

Thus, the ring-shaped cover 40 and the outer manifold 50 may be coupled to each other by the coupling members, which face each other, of the ring-shaped cover 40 and the outer manifold 50.

In this case, each of the coupling members may be understood as a screw (or nut), and each of the plurality of coupling parts may be understood as a screw hole (or bolt hole).

Also, the ring-shaped cover 40 may have a ring shape provided with a horizontal part 44 facing a top surface of the outer flange 28 of the outer tube 20 and a first vertical part 42 disposed on the side portion.

In this case, the outer tube 20 may be inserted into a ring-shaped through-hole of the ring-shaped cover 40.

The first vertical part 42 of the ring-shaped cover 40 may be disposed at a position outside the outer flange 28, and the screw holes (or bolt holes) as the coupling parts may be arranged along the ring-shaped side portion to vertically pass through the first vertical part 42.

The outer manifold 50 supports a lower end of the outer tube 20 and defines a first inner space 59 connected to the protective space 22.

In this case, the protective space 22 and the first inner space 59 may define one independent space communicating with each other.

The first inner space 59 provides the protective space 22 when the inner tube 30 is installed by entering the outer tube 20 and provides an appropriate spaced space between the two tubes.

Since a diameter of the inner tube 30 is less than that of the outer tube 20, a diameter of a second sidewall of the inner manifold 60 may also less than that of a first sidewall of the outer manifold 50. As a result, the first inner space 59 may be naturally defined.

The outer manifold 50 may include a first sidewall 55, a first upper flange 51, and a first lower flange 53.

The first sidewall 55 may be configured to define the cylindrical first inner space 59.

Also, the first sidewall 55 has an outer gas exhaust port 54 and an outer gas supply port 52 and may further include an outer pumping port (not shown).

The outer gas exhaust port 54 is configured to exhaust an inert gas injected into the protective space 22 and may be connected to an outer exhaust line 702 to be described later.

The outer gas supply port 52 is configured to inject the inert gas into the protective space 22 and may be connected to a first supply tube 602 to be described later.

The outer pumping port is configured to be connected to an external vacuum pump 750 to generate a pressure of the protective space 22 as a lower pressure than the atmospheric pressure and may be connected to an outer vacuum pumping line 762 to be described later.

The first upper flange 51 may be configured to extend outwardly around an upper portion of the first sidewall 55 and configured to support the lower end of the outer tube 20, that is, the outer flange 28.

Here, as described above, the first upper flange 51 may be provided with a plurality of coupling parts capable of coupling the coupling member to the side portion.

For example, screw holes (or bolt holes) respectively corresponding to positions at which the coupling parts of the ring-shaped cover 40 are disposed may be defined along the side portion so that the coupling parts of the ring-shaped cover 40 vertically pass through the screw holes (or bolt holes).

The first lower flange 53 extends outward from a lower circumference of the first sidewall 55 and is coupled to the inner manifold 60 so that a plurality of first coupling parts capable of coupling the coupling member are disposed along the circumference.

The outer manifold 50 may further include coupling parts 56 extending laterally at a plurality of positions of the first upper flange 51 and having vertical through-holes.

The coupling parts 56 may be coupled to an upper structure of the upper portion of the ring-shaped cover 40 by bolts 58 passing through the through-holes.

Here, the upper structure may be at least one of the partition wall (CA), the heater base 14, or the heater 10, and the coupling of the bolts 58 and the through-holes are exemplified as a coupling material for coupling the coupling parts 56 to the upper structure. The coupling material may be variously modified according to intension of the manufacturer.

Due to the structure of the outer manifold 50, the ring-shaped cover 40 and the outer manifold 50 may be coupled to each other by interposing the outer flange 28 of the outer tube 20 therebetween.

Also, the outer manifold 50 may be coupled to the upper structure disposed at the upper portion of the ring-shaped cover 40, i.e., at least one of the partition wall CA, the heater base 14, or the heater 10 by using the coupling parts 56.

Also, the first lower flange 53 of the outer manifold 50 is coupled to the second upper flange 61 of the inner manifold 60 with the inner flange 38 of the inner tube 30 therebetween.

The inner manifold 60 is coupled to the lower portion of the outer manifold 50 to support the lower end of the inner tube 30 and define the second inner space 68 connected to the reaction space 32.

Here, the reaction space 32 and the second inner space 68 define one independent space communicating with each other.

The inner manifold 60 may include a second sidewall 65, a second upper flange 61 and a second lower flange 63.

The second sidewall 65 may be configured to define the cylindrical second inner space 68.

Also, the second sidewall 65 may include an inner gas supply port 62 for supplying a process gas, an inner gas exhaust port 64 for exhausting the process gas, and an inner pumping port 66.

The inner gas supply port 62 is configured to supply the process gas to the reaction space 32 and may be connected to a second supply tube 622 to be described later.

The inner gas exhaust port 64 may be configured to exhaust the process gas injected into the reaction space 32 and may be connected to an inner exhaust line 722 to be described later.

The inner pumping port 66 may be configured to be connected to an external vacuum pump 750 to generate the pressure of the reaction space 32 as a lower pressure than the atmospheric pressure and may be connected to an inner vacuum pumping line 742 to be described later.

The second upper flange 61 extends outward from an upper circumference of the second sidewall 65 and is coupled to the outer manifold 50 so that a plurality of second coupling parts capable of coupling the coupling member are disposed along the circumference.

More particularly, the second upper flange 61 is configured to support the lower end of the inner tube 30, i.e., the inner flange 38 and is coupled to the first lower flange 53 of the outer manifold 50.

That is, the first lower flange 53 of the outer manifold 50 and the second upper flange 61 of the inner manifold 60 may be coupled to each other by coupling of the first coupling part and the second coupling part, which correspond to each other by the coupling member such as the screws (or bolts).

Here, the first coupling part and the second coupling part may be exemplified as screw holes (or bolt holes).

Here, the first lower flange 53 of the outer manifold 50 and the second upper flange 61 of the inner manifold 60 may be coupled with the inner flange 38 of the inner tube 30 therebetween.

Also, a second vertical part 67 may be additionally provided at the side portion of the second upper flange 61 of the inner manifold 60 to provide the second coupling part.

The second vertical part 67 may be provided in a region corresponding to the side portion of the first lower flange 53 of the outer manifold 50 at a position outside the inner flange 38.

As a result, the second vertical part 67 may be disposed to vertically pass through the screw holes (or bolt holes) that are the second coupling parts while the screw holes (or bolt holes) are defined along the side portion.

Therefore, the second vertical parts 67 of the first lower flange 53 and the second upper flange 61 may be coupled to each other by the coupling member such as the screw (or bolt). As a result, the outer manifold 50 and the inner manifold 60 may be coupled to each other with the inner flange 38 therebetween.

The second lower flange 63 extends outward from the lower portion of the second sidewall 65 and is sealed by the cap flange 70.

In the present invention, as described above, the inner manifold 60 and the outer manifold 50 are disposed on the lower portions of the inner tube 30 and the outer tube 20, respectively.

Thus, it is possible to separate the inner tube 30 and the outer tube 20 from each other and supply and exhaust a gas independently therefrom. Also, the structures of supplying and exhausting the gas may be concentrated into the lower portions of the inner tube 30 and the outer tube 20 to secure convenience of the design and assembly.

The substrate processing apparatus according to the present invention may be provided with a plurality of sealing parts installed at various locations.

For example, the sealing parts may be between a bottom surface of the outer flange 28 and a top surface of the first upper flange 51, between a bottom surface of the first lower flange 53 and an upper surface of the inner flange 38, and between a bottom surface of the inner flange 38 and a top surface of the second upper flange 61, respectively.

Each of the sealing parts may be exemplarily constituted by an O-ring OR, and the O-ring OR may be provided with an O-ring groove (not shown) for inserting a portion of the O-ring OR into the top surface of the first upper flange 51, the bottom surface of the first lower flange 53, and the top surface of the second upper flange 61.

The cap flange 70, the base plate 200, an elevating plate 210, and a clamp module 300 of the substrate processing apparatus according to the present invention will be described in detail with reference to FIGS. 5 and 6.

The cap flange 70 is configured to be elevatable at the lower portion of the second lower flange 63 of the inner manifold 60 and is variously provided.

The cap flange 70 ascends to allow the top surface to be in close contact with the second lower flange 63 of the inner manifold 60, thereby sealing the second inner space 68.

Here, since the second inner space 68 is connected to the upper reaction space 32 to define one space, the cap flange 70 may be in close contact with the second lower flange 63 so that the reaction space 32 within the inner tube 30 and the second inner space 68 of the inner manifold 60 are sealed together.

The cap flange 70 may be provided in a disk shape to cover the lower portion of the inner manifold 60.

The cap flange 70 ascends or descends by being interlocked with the ascending or the descending of the elevating plate 210.

The cap flange 70 may ascend so that the side portion of the top surface thereof has a first spaced interval Tg from the bottom surface of the inner manifold 60 to close the lower portion of the inner manifold 60.

Thus, the cap flange 70 covers the lower portion of the inner manifold 60 to isolate the reaction space 32 of the inner tube 30 connected to the inner manifold 60 from the outside.

Also, a rotation plate 90 on which the boat 80 is seated may be additionally provided on the cap flange 70.

The rotation plate 90 is configured to be coupled to the lower portion of the boat 80 seated on the upper portion and to receive rotational force from a lower driving part 400.

As a result, the rotation plate 90 may be configured to allow the upper boat 80 to rotate by the rotational force of the driving part 400.

Thus, when the boat 80 rotates during the process through the rotation plate 90, a gas for the reaction may be uniformly supplied to the substrates loaded on the boat 80, and as a result, the yield may be improved.

Here, the boat 80 may ascend through the first inlet of the inner tube 30 and a passage of the manifold assembly to process the loaded substrate.

Also, the boat 80 may descend through the first inlet of the inner tube 30 and the passage of the manifold assembly to unload the substrate on which the process is completed.

The base plate 200, the elevating plate 210, the clamp module 300, and the driving part 400 are disposed under the cap flange 70.

First, the base plate 200 may be fixed while maintaining an interval in parallel to the lower portion of the cap flange 70.

More particularly, the base plate 200 has a structure coupled to the cap flange 70 through a vertical rod. Since an upper portion of the vertical rod is screw-coupled to the cap flange 70, and a lower portion of the vertical rod is screw-coupled to the base plate 200, the base plate 200 and the cap flange 70 may be installed while maintaining an interval in parallel with each other.

Here, the base plate 200 is configured to install a plurality of clamp modules 300 to be described later. Here, the plurality of clamp modules 300 may be distributed and installed at a plurality of positions of the base plate 200.

The clamp module 300 includes a clamp 310 having a clamping channel 312 facing a side surface of the cap flange 70.

Here, the clamp module 300 may drive the clamp 310 to clamp the cap flange 70 and the second lower flange 63 of the inner manifold 60, which are in close contact with each other by a second spaced interval, inside the clamping channel 312.

Also, the clamp module 300 includes the clamp 310, a clamp bracket 320, and an actuator 330.

The clamp 310 may have the clamping channel 312 facing the side surface of the cap flange 70 as described above, and the clamping channel 312 may be provided in a clip shape.

The clamping bracket 320 vertically supports the clamp 310 and may be provided in a plate shape.

The actuator 330 is fixed to the bottom surface of the base plate 200 and connected to the clamp bracket 320 through a rod 332.

The actuator 330 allows the clamp bracket 320 and the clamp 310 to move forward or backward by driving the rod 332.

Therefore, the clamp 310 may move between a locking position for the clamping (corresponding to FIG. 5) and a releasing position for releasing the clamping (corresponding to FIG. 6) by driving the actuator 330.

The elevating plate 210 is provided below the base plate 200, and the elevating plate 210 is configured to maintain a spaced interval from the base plate 200 by elastic force of an elastic part.

Here, the elastic part may be a spring 212 disposed between the base plate 200 and the elevating plate 210.

When the spring 212 ascends so that the cap flange 70 is in contact with the bottom surface of the inner manifold 60, the spring 212 may provide elastic force for allowing the upper surface of the cap flange 70 and the bottom surface of the inner manifold 60 to be in close contact with each other in a state of being spaced the first spaced interval Tg by the O-ring.

The elevating plate 210 may be movably coupled while being spaced apart from the base plate 200 by using a plurality of pins 214 inserted in the spring 212, and the spaced interval between the elevating plate 210 and the base plate 200 may be maintained by the elasticity of the spring 212.

The elevating plate 210 may be coupled to an elevating module (not shown), which provides elevating force by driving a motor, to ascend and descend.

The elevating plate 210 ascends or descends together with the upper base plate 200, the cap flange 70, the rotation plate 90, and the boat 80.

The spring 212 may buffer vibration generated when the elevating plate 210 ascends and descends, and when the elevating plate 210 ascends, the spring 212 may provide the elasticity for allowing the cap flange 70 to be in close contact with the bottom surface of the inner manifold 60 at a desired position.

As a result, the cap flange 70 and the lower portion of the inner manifold 60 may be clamped by the clamps 310 and be maintained in the state of being in close contact with each other with a second spaced interval therebetween.

Therefore, the cap flange 70 and an edge of the inner manifold 60 may be maintained in the seated state by the close contact without being gapped by the second spaced interval or more by the high pressure even though the high-pressure process of processing the substrate is performed in the reaction space 32.

Hereinafter, the coupling between the inner manifold 60 and the cap flange 70 by the cap flange and base plate 200 and also the elevating plate 210 and the clamp module 300 as described above will be described.

Figure 6:
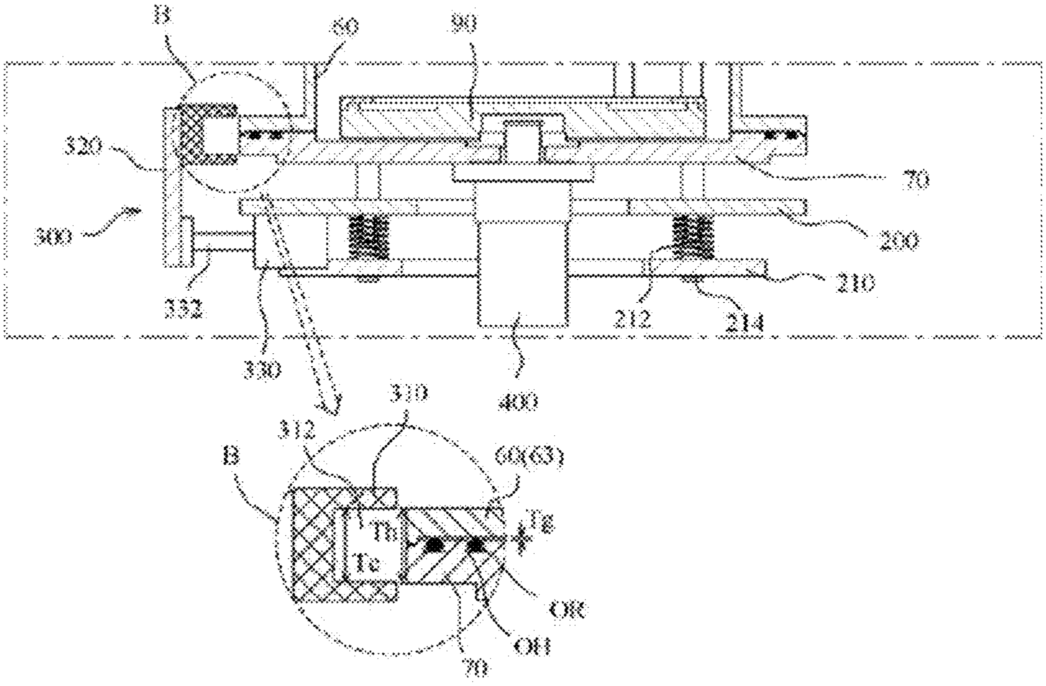
FIG. 6 is a cross-sectional view illustrating an example of a state in which the clamping of the clamping of the substrate processing apparatus of FIG. 1 is released.

As illustrated in FIG. 6, the cap flange 70 according to the present invention may be close by the first spaced interval Tg with the second lower flange 63 and the O-ring therebetween.

Here, the cap flange 70 and the second lower flange 63, which are spaced the first spaced interval Tg from each other, has a thickness Th greater than a height Tc of the clamping channel 312 of the clamp 310 of each of the plurality of clamp modules 300.

Thus, there is a limitation that the cap flange 70 and the second lower flange 63 are difficult to be clamped inside the clamping channel 312.

To overcome this limitation, the substrate processing apparatus according to the present invention includes an inner pumping part 740 that performs pumping with respect to the reaction space 32 of the inner tube 30 to be described later.

The inner pumping part 740 is configured to perform the pumping with respect to the reaction space 32 so that the reaction space 32 has a pressure less than the atmospheric pressure, and a more detailed description thereof will be provided later.

The pumping by the inner pumping part 740 may be performed to reduce the space between the cap flange 70 and the second lower flange 63.

More particularly, when the pressure of the reaction space 32 of the inner tube 30 is less than the atmospheric pressure due to the pumping of the inner pumping part 740, the top surface of the cap flange 70 may be adjacent to the bottom surface of the second lower flange 63 of the inner manifold 60 by the first spaced interval Tg with the O-ring therebetween.

More particularly, the top surface of the cap flange 70 and the bottom surface of the second lower flange 63 of the inner manifold 60 are in close contact with the O-rings through the elevation of the cap flange 70 so as to be close by the first spaced interval Tg with the O-ring therebetween.

Thereafter, when the pressure of the reaction space 32 of the inner tube 30 is less than the atmospheric pressure due to the pumping of the inner pumping part 740, the top surface of the cap flange 70 may additionally ascend due to a pressure difference with the outside, and thus the O-ring may be contracted so that the top surface of the cap flange 70 is adjacent to the bottom surface of the second lower flange 63 of the inner manifold 60 by the second spaced interval less than the first spaced interval Tg.

In this process, the pumping of the inner pumping part 740 may be understood that slow pumping and main pumping are sequentially performed.

Figure 5:
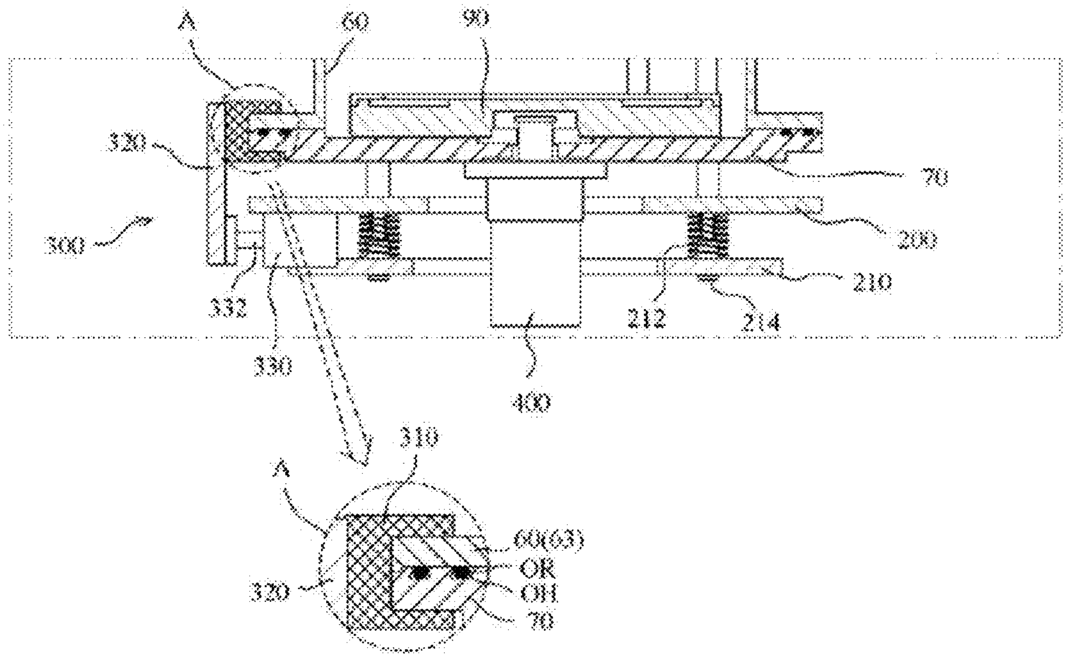
FIG. 5 is a partial cross-sectional view for explaining clamping of the manifold assembly and a cap flange by a clamping module of the substrate processing apparatus of FIG. 1.

Thus, as illustrated in FIG. 5, each of the cap flange 70 and the second lower flange 63, which are in close contact with each other by the second spaced interval may have a thickness at which the cap flange 70 and the second lower flange 63 are capable of being clamped with the clamping channel 312 of the clamp 310 of each of the plurality of clamp modules 300.

Therefore, as illustrated in FIG. 5, the plurality of clamp modules 300 may clamp the cap flange 70 and the second lower flange 63 of the inner manifold 60, which are in close contact with each other by the second spaced interval through the O-ring.

Here, each of the first spaced interval Tg and the second spaced interval may be understood as a difference due to the contraction of the O-ring OR that is disposed between the bottom surface of the inner manifold 60 and the top surface of the cap flange 70 by the depressurization of the inner pumping part 740.

For explanation of an embodiment, the second spaced interval may be exemplified as a fact in which the bottom surface of the inner manifold 60 and the top surface of the cap flange 70 contact each other without a gap as the O-ring OR is contracted.

In an embodiment of the present invention, the depressurization may be used even when the clamping of the cap flange 70 and the inner manifold 60, which are clamped by the clamp 310, is released after the high-pressure processing period for processing the substrate has ended.

That is, according to one of the embodiments of the present invention, after the high-pressure process period for processing the substrate, the pressure of the reaction space 32 of the inner tube 30, which is in the high-pressure state, may be lowered to the atmospheric pressure through the exhaust and then be further lowered to a pressure less than the atmospheric pressure through the pumping so that the cap flange 70 is adjacent to the inner manifold 60 by the second spaced interval.

Here, the cap flange 70 and the inner manifold 60 are adjacent to each other by a second interval, and then the clamp modules 300 may drive the clamps 310 from the locking position to the releasing position to release the clamping between the cap flange 70 and the inner manifold 60.

In this process, the reaction space 32 of the inner tube 30 may have a low pressure so that a gap between the cap flange 70 and the inner manifold 60 is narrowed, and then the inner manifold 60 and the cap flange 70 may be clamped or unclamped.

Thus, an embodiment of the present invention has an advantage of preventing leakage from occurring between the inner manifold 60 and the cap flange 70 due to the high pressure during the processing period for processing the substrate.

The thermocouple protection tube 100 of the substrate processing apparatus according to the present invention will be described in detail with reference to FIGS. 1, 3 and 7.

In the present invention, the reaction space 32 is defined using the vertical cylindrical inner tube 30 having the second dome-shaped ceiling having the dome shape.

In this case, the reaction space 32 may be divided into a ceiling region defined by the dome-shaped ceiling and a reaction region defined below the ceiling region in which the boat 80 is disposed for the process.

According to an embodiment of the present invention, a thermocouple and thermocouple protection tube 100 capable of sensing a temperature for the entire reaction space 32 including the upper ceiling region as well as the reaction region in which the boat 80 is disposed may be provided.

The thermocouple protection tube 100 according to the present invention may include a thermocouple protection tube insertion end 104 for inserting the thermocouple protection tube 100 into the inner tube 60 as illustrated in FIGS. 1 and 3.

More particularly, a thermocouple coupler for coupling the thermocouple protection tube 100 may be disposed on the second sidewall 65 of the inner manifold 60.

In this case, the thermocouple protection tube insertion end 104 for inserting the thermocouple protection tube 100 may be provided on the thermocouple coupler.

The thermocouple protection tube insertion end 104 is configured to pass through the second sidewall 65 of the inner manifold 60 and is configured to guide the installation of a lower tube 103, which will be described later, of the thermocouple protection tube 100 therein.

That is, the thermocouple protection tube 100 is installed vertically in the reaction space 32 of the inner tube 30 and is configured so that the lower portion thereof is drawn out through the inner manifold 60.

More particularly, the thermocouple protection tube 100 includes an extension tube 101 at an upper side, a vertical tube 102 disposed vertically in succession to the extension tube; and a lower tube 103 that is continuously connected to the vertical tube and bent from the vertical tube to facilitate the drawing out to the outside.

Here, the extension tube 101, the vertical tube 102, and the lower tube 103 may be made of a quartz material and be integrated with each other to define a tube that is sealed with respect to the reaction space 32.

The extension tube 101 is disposed in the upper ceiling region of the reaction space 32.

The vertical tube 102 is disposed in the reaction region, in which the boat 80 is disposed, within the reaction space 32 and extends to the inner manifold 60 that is disposed at the lower side thereof.

The lower tube 103 is disposed in the second inner space 68 of the inner manifold 60.

Particularly, the lower tube 103 passes through the thermocouple protection tube insertion end 104 of the second sidewall 65 of the inner manifold 60 and is drawn out to the outside, and an inlet for inserting a plurality of thermocouples TC1 to TC5 are provided in the end of the drawn lower tube 103.

The plurality of thermocouples TC1 to TC5 may be inserted into the thermocouple protection tube 100 through the inlet of the lower tube 103 and be provided with a detection part for sensing a temperature at different positions in the reaction space 32.

In this case, the detection part may be understood as a sensor that generates current according to the sensed temperature and may be understood as being provided at an extending end of each of the thermocouples TC1 to TC5.

Figure 7:
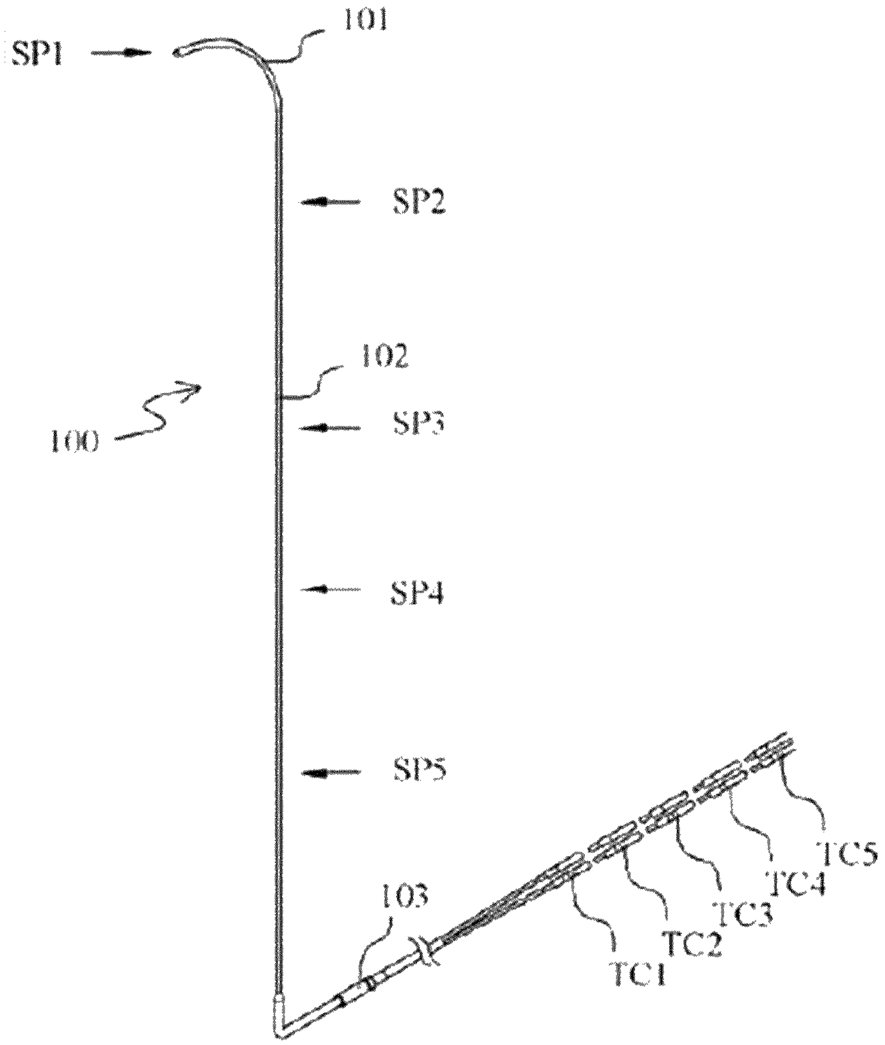
FIG. 7 is a perspective view of a thermocouple protection tube on which a thermocouple of the substrate processing apparatus of FIG. 1 is installed.

According to an embodiment of the present invention, the thermocouple is illustrated as having five thermocouples as illustrated in FIG. 7.

In an embodiment of the present invention, it is preferable that the detection part of at least one thermocouple is disposed in the extension tube 101.

That is, the detection part of at least one thermocouple may be disposed in the ceiling region, and the detection parts of the remaining thermocouples may be disposed in the reaction region with respect to the thermocouple protection tube 100.

The positions of the detection parts of the plurality of thermocouples TC1 to TC5, i.e., the plurality of temperature sensing positions may be illustrated as reference symbols SP1 to SP5 in FIG. 7.

Among these, the temperature sensing position SP1 corresponds to the ceiling region, and the remaining temperature sensing positions SP2 to SP5 are disposed in the reaction region.

In an embodiment of the present invention, the temperature sensing positions SP1 to SP5 are set at different heights. The setting of the temperature sensing position may be understood as designing a position at which each of the detection parts of the plurality of thermocouples TC1 to TC5 is formed.

As the temperature sensing positions SP1 to SP5 are set as described above, the plurality of thermocouples TC1 to TC5 are installed in the inner tube of the thermocouple protection tube 100, and the detection parts are configured to be disposed at different temperature sensing positions.

For example, the detection part of the thermocouple C1 may be disposed at the temperature sensing position SP1, the detection part of the thermocouple TC2 may be disposed at the temperature sensing position SP2, the detection part of the thermocouple TC3 may be disposed at the temperature sensing position SP3, the detection part of the thermocouple TC4 may be disposed in the temperature sensing position SP4, and the detection part of the thermocouple TC5 may be disposed at the temperature sensing position SP5.

Each of the thermocouples TC1 to TC5 may perform temperature sensing by the detection parts and may output current corresponding to the sensed temperature through a pair of terminals.

As described above, each of the plurality of thermocouples TC1 to TC5 has a pair of terminals for outputting current corresponding to the sensed temperature, and the terminals of the plurality of thermocouples TC1 to TC5 are drawn out through the lower tube 103 extending to the outside of the inner manifold 60.

As described above, an upper end of the extension tube 101 of the thermocouple protection tube 100 and the temperature sensing position SP1 of the thermocouple TC1 are preferably disposed at a height above the middle of the ceiling region.

For example, the upper end of the extension tube 101 may be disposed under the uppermost portion of the domed ceiling.

Also, the extension tube 101 disposed on the upper portion of the thermocouple protection tube 100 may have a shape that extends to the ceiling region and is bent inward.

For example, the extension tube 101 may have a shape that is refracted to the inside of the ceiling region to have an inclination angle.

Also, the thermocouple protection tube 100 may have a shape that is determined so as not to interfere with a flow of gas or generate a vortex in the reaction space 32.

For this, the extension tube 101 constituting an upper portion of the thermocouple protection tube 100 may have a shape that is curved to the inside of the ceiling region to have a curve.

More particularly, the extension tube 101 has the same curvature as the second dome-shaped ceiling of the inner tube 30, maintains a uniform spaced interval from the second dome-shaped ceiling, and has an extending shape while bent toward an upper side of the second dome-shaped ceiling.

Also, the vertical tube 102 of the thermocouple protection tube 100 is vertically fixed to maintain a uniform spaced interval from the inner wall of the inner tube 30.

The extension tube 101, the vertical tube 102, and the lower tube 103 of the thermocouple protection tube 100 may have the same inner diameter and outer diameter.

On the other hand, when the number of thermocouples inserted therein is many, the inner diameter and the outer diameter may gradually increase toward a lower side.

An embodiment of the present invention includes a heater 10 for heating the reaction space 32 to process the substrate in a high-temperature environment.

The heater 10 heats the outer tube 20 and the inner tube 30 in the heating space 12.

Here, the reaction space 32 of the inner tube 30 has to be heated at a uniform temperature distribution as a whole.

Therefore, the heater 10 needs to be configured to independently control heating for each position.

For this, the heater 10 may be manufactured to include a plurality of heating blocks (not shown) corresponding to the temperature sensing positions. Here, it is preferable that the heating temperature of each heating block is independently controlled.

Also, the above-described temperature sensing positions SP1 to SP5 correspond to the heating blocks, respectively. One of the temperature sensing positions SP1 to SP5, i.e., the temperature sensing position SP1, may be set to correspond to the heating block for heating the ceiling region.

Also, the remaining temperature sensing positions SP2 to SP5 may be set to one-to-one correspond to the remaining heating blocks for heating the reaction region in which the boat 80 is disposed.

As described above, in the thermocouples TC1 to TC5 for the temperature sensing, the detection parts are provided for each of the temperature sensing positions SP1 to SP5, and the temperature is sensed for each position in the ceiling region and the reaction region.

Each of the heating blocks may independently control a heating temperature in response to a sensing signal of the thermocouple at the corresponding temperature sensing position.

Thus, according to an embodiment of the present invention, since the temperature sensing and the temperature control for the ceiling region defined by using the vertical cylindrical inner tube 30 having the dome-shaped ceiling are performed, the temperature sensing and the heating control may be performed on the entire reaction space 32 to maintain a uniform temperature in the entire reaction space 32 for processing the substrate.

Hereinafter, a gas utility according to the present invention will be described in detail with reference to FIGS. 8 to 15.

In an embodiment of the present invention, the reaction space 32 has a high pressure higher than the atmospheric pressure, and then a series of processes having a low pressure lower than the atmospheric pressure with respect to at least one of the thin films before, during, and after deposition of the thin film.

For this, according to an embodiment of the present invention, a gas utility that performs pressurization, depressurization, and exhaust with respect to the protective space 22 and pressurization, depressurization, and exhaust with respect to the reaction space 32 may be provided.

For example, the gas utility may perform a process in which the reaction space 32 has a high pressure higher than the atmospheric pressure and then has a low pressure lower than the atmospheric pressure.

Here, when the reaction space 32 is above the atmospheric pressure, a first internal pressure PO of the protective space 22 is maintained higher than a second internal pressure PI of the reaction space 32 by a uniform difference.

Also, the gas utility may allow the reaction space 32 to have a low pressure less than the atmospheric pressure so as to perform a leak check before the processing period for processing the substrate or clamp the cap flange 70 and the inner manifold 60.

An embodiment of the present invention including the gas utility will be described with reference to FIGS. 8 to 13, and changes of the second internal pressure PI of the reaction space 32 and the first internal pressure PO of the protective space 22 by the gas utility may be understood with reference to FIGS. 14 and 15.

Since the heater 10, the outer tube 20, and the inner tube 30 are understood with reference to the embodiments of FIGS. 1 to 2, their duplicated descriptions will be omitted.

As a gas to be introduced into the protective space 22, nitrogen may be used as an inert gas.

Also, as a gas introduced into the reaction space 32, a process gas including the inert gas or a processing gas for processing the substrate may include a gas containing one or more elements such as hydrogen (H), oxygen (O), nitrogen (N), chlorine (Cl), and fluorine.

For example, the process gas may be used in the form of hydrogen ($H_2$), deuterium ($D_2$), oxygen ($O_2$), water vapor ($H_2O$), ammonia ($NH_3$), and the like.

Various embodiments of the gas utility according to the present invention will be described with reference to the accompanying drawings.

Figure 8:
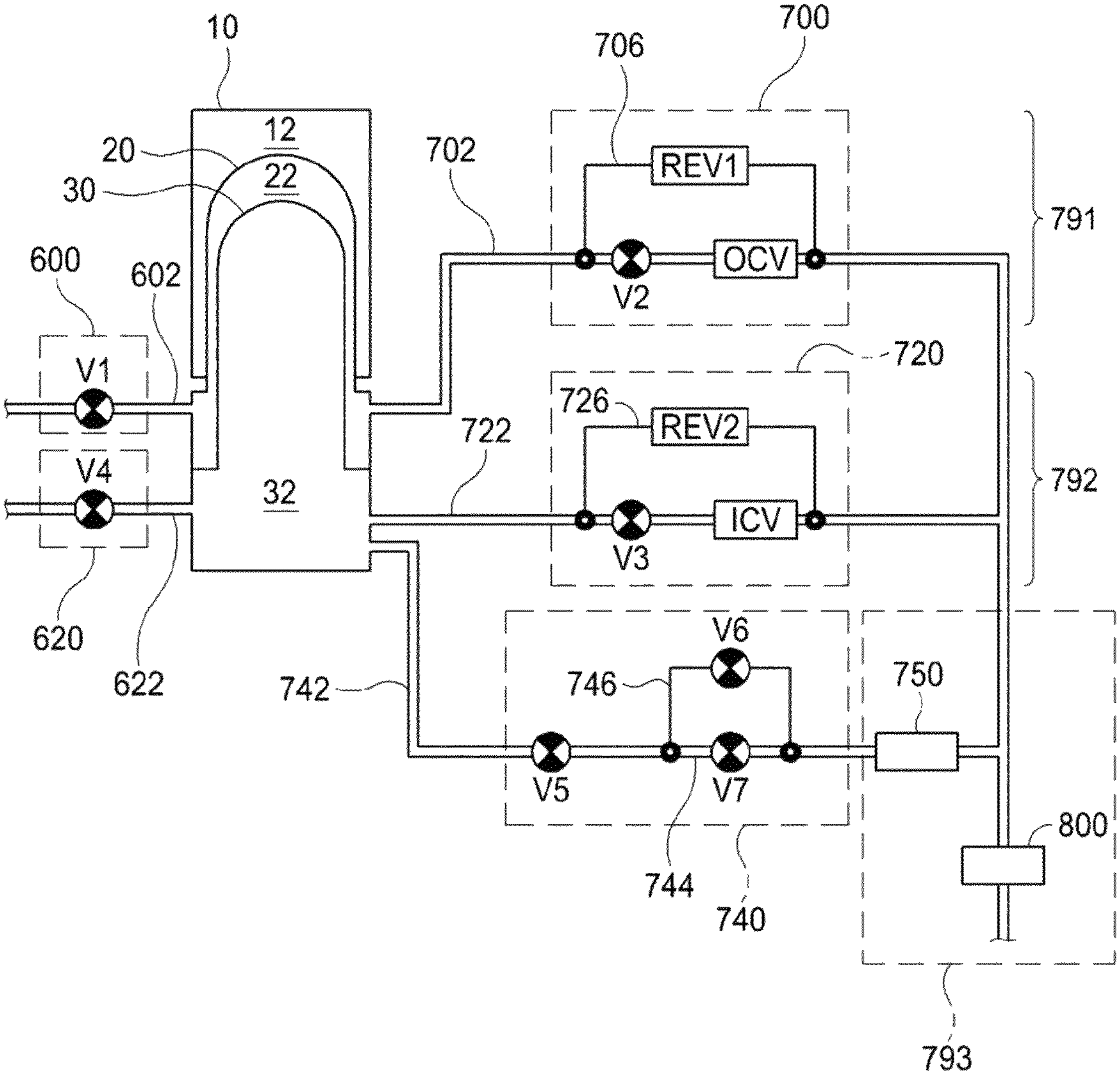
FIG. 8 is a system diagram illustrating a first embodiment of a gas utility of the substrate processing apparatus of FIG. 1.

As illustrated in FIG. 8, a gas utility according to a first embodiment of the present invention is a first embodiment may be a constituent that controls exhaust of each of a reaction space 32 and a protective space 22 to perform a pressure change process including a high-pressure process higher than atmospheric pressure and a low-pressure process lower than the atmospheric pressure for a plurality of substrates introduced into the reaction space and may be variously modified.

For example, the gas utility is provided with a first gas supply part 600 supplying an inert gas to the protective space 22 through a first supply tube 602 and a second gas supply part 620 supplying a process gas to the reaction space 32 through a second supply tube 622.

Also, the gas utility according to the present invention includes an outer exhaust part 791 for exhausting the protective space 22 and an inner exhaust part 792 for exhausting the reaction space 32.

Also, the gas utility may include an inner pumping part 740 that connects an inner pumping port 66 to a vacuum pump 750 and performs pumping at a pressure lower than the atmospheric pressure in the reaction space 32.

The first gas supply part 600 includes a first supply valve V1 connected to the first supply tube 602. Here, the first supply valve V1 may control a supply amount of inert gas so that the inert gas is supplied at various pressures so as to exhaust or pressurize the inert gas.

Here, the first supply tube 602 may be connected to an outer gas supply port 52 for supplying the inert gas of an outer manifold 50.

That is, the first supply tube 602 may be connected to the protective space 22 of the outer tube 20 through the outer manifold 50.

The second gas supply part 620 includes a second supply valve V4 connected to the second supply tube 622, and the second supply valve V4 may control a supply amount of process gas so as to supply the process gas at various pressures.

Here, the second supply tube 622 may be connected to the inner gas supply port 62 for supplying the process gas of an inner manifold 60.

That is, the second supply tube 622 may be connected to the reaction space 32 of the inner tube 30 through the inner manifold 60.

The outer exhaust part 791 may control the exhaust to the protective space 22 and may be variously modified.

For example, the outer exhaust part 791 may include an outer exhaust line 702 connecting the outer gas exhaust port 54 to an external exhaust device 793 and a first high-pressure control part 700 installed on the outer exhaust line 702 to control exhaust of the inert gas introduced into the protective space 22.

Here, the outer exhaust line 702 may be connected to the outer gas exhaust port 54 that exhausts the inert gas of the outer manifold 50.

That is, the outer exhaust line 702 may communicate with the protective space 22 of the outer tube 20 through the outer manifold 50.

The first high-pressure control part 700 may control a first internal pressure PO of the protective space 22 through the outer exhaust line 702 and may be variously modified.

For example, the first high-pressure control part 700 may include a first high-pressure exhaust valve V2 and a first high-pressure control valve OCV, which are installed on the outer exhaust line 702, and a first relief valve REV1 provided in a first safety line 706 that is disposed in parallel to the outer exhaust line 702.

Here, the first high-pressure exhaust valve V2 may be opened to exhaust a gas of the protective space 22 of the outer tube 20.

Also, the first high-pressure control valve OCV may control an amount of gas to be exhausted through the outer exhaust line 702.

Also, the first relief valve REV1 may be mechanically opened for the exhaust when a predetermined high-pressure or more is detected.

Also, the first high-pressure control part 700 may include a first pressure gauge (not shown) installed on the outer exhaust line 702.

In this case, a separately provided control part (not shown) may check a pressure in the protective space 22 through the first pressure gauge (not shown) installed in the outer exhaust line 702 to transmit a control signal for controlling the first high-pressure control valve OCV The inner exhaust part 792 may be configured to perform the exhaust with respect to the reaction space 32 and may be variously modified.

For example, the inner exhaust part 792 may include an inner exhaust line 722 connecting the inner gas exhaust port 64 to the external exhaust device 793 and a second high-pressure control part 720 installed on the inner exhaust line 722 to control exhaust of the inert gas and the process gas introduced into the reaction space 32.

Here, the inner exhaust line 722 is connected to the inner gas supply port 64 for exhausting the process gas of the inner manifold 60, and the inner vacuum pumping line 742 is connected to the inner pumping port 66 for generating a low pressure of the inner manifold 60.

That is, the inner exhaust line 722 and the inner vacuum pumping line 742 may be connected to the reaction space 32 of the inner tube 30 through the inner manifold 60.

The second high-pressure control part 720 may be configured to control the second internal pressure PI of the reaction space 32 through the inner exhaust line 722 and may be variously modified.

For example, the second high-pressure control part 720 may include a second high-pressure exhaust valve V3 and a second high-pressure control valve ICV, which are installed on the inner exhaust line 722, and a second relief valve REV2 provided in a second safety line 726 that is disposed in parallel to the inner exhaust line 722.

Here, the second high-pressure exhaust valve V3 may be opened to exhaust a gas of the reaction space 32 of the inner tube 30.

Also, the second high-pressure control valve ICV may control an amount of gas to be exhausted through the inner exhaust line 722.

Also, the second relief valve REV2 may be mechanically opened for the exhaust when a predetermined high-pressure or more is detected.

The first relief valve REV1 and the second relief valve REV2 are preferably configured to be opened for the exhaust at the same high-pressure or more.

Also, the second high-pressure control part 720 may include a second pressure gauge (not shown) installed on the inner exhaust line 722.

In this case, the control part may check a pressure in the protective space 32 through the second pressure gauge (not shown) installed in the inner exhaust line 722 to transmit a control signal for controlling the second high-pressure control valve ICV.

Details of an operational relationship between the first pressure gauge and the second pressure gauge will be described later.

The inner pumping part 740 connects the inner pumping port 66 to the vacuum pump 750 and performs pumping at a pressure lower than the atmospheric pressure in the reaction space 32 and may be variously modified.

For example, the inner pumping part 740 may include a second low-pressure on/off valve V5, a second main pumping valve V7, and a second slow pumping valve V6.

The second low-pressure on/off valve V5 is installed on the inner vacuum pumping line 742 and may be opened to generate a low pressure in the reaction space 32 of the inner tube 30.

Also, the second main pumping valve V7 is installed on a second main pumping line 744 connected to the inner vacuum pumping line 742 to control an amount of gas to be pumped through the inner vacuum pumping line 742.

Also, the second slow pumping valve V6 is installed on a second slow pumping line 746 in parallel with the second main pumping valve V7 to control an amount of gas to be pumped through the second slow pumping line 746.

An operational relationship regarding the pressure control through the gas utility of the first embodiment will be described below.

In order to control the pressure of the protective space 22 of the outer tube 20, the inert gas is supplied from the first supply tube 602 to the outer tube 20, or the exhaust of the outer tube 20 may be controlled.

Also, in order to control the pressure of the reaction space 32 of the inner tube 30, the process gas may be supplied from the second supply tube 622 to the inner tube 30, or the exhaust of the inner tube 30 may be controlled by the inner exhaust gas 722. The pumping of the inner tube 30 may be performed by the inner vacuum pumping line 742.

More particularly, when the pressure of the reaction space 32 is desired to be higher than the atmospheric pressure, the second high-pressure control part 720 may control an amount of gas to be exhausted through the inner exhaust line 722 so that the second internal pressure PI is higher than the atmospheric pressure.

Here, the first high-pressure control part 700 may control an amount of air to be exhausted through the outer exhaust line 702 so that the first internal pressure PO is higher than the second internal pressure PI.

Particularly, in this case, the amount of gas to be exhausted through each of the outer exhaust line 702 and the inner exhaust line 722 may be controlled so that the first internal pressure PO has a higher pressure with a uniform pressure difference than the second internal pressure PI.

For this, the second high-pressure control valve ICV may control an amount of gas to be exhausted through the inner exhaust line 722 based on a preset set value.

Also, the first high-pressure control valve OCV may be configured to control an amount of gas to be exhausted through the outer exhaust line 702 so that the pressure of the outer exhaust line 702 is controlled based on the pressure of the inner exhaust line 722.

Also, when the pressure of the reaction space 32 is desired to be less than the atmospheric pressure, the first high-pressure control part 700 and the second high-pressure control part 720 may control the exhaust of the outer exhaust line 702 so that the first internal pressure PO is maintained at the atmospheric pressure and control the exhaust and pumping of each of the inner exhaust line 722 and the inner vacuum pumping line 742 so that the second internal pressure PI has a low pressure.

More particularly, the outer exhaust line 702 is opened through the high-pressure control valve OCV, the first internal pressure PO may be maintained at the atmospheric pressure.

Also, the second internal pressure PI of the reaction space 32 of the inner tube 30 may be depressurized by the pumping through the second slow pumping valve V6 and then may be depressurized again by the pumping through the second main pumping valve V7.

Here, the second low-pressure on/off valve V5 maintains an open state while pumping is performed by the second slow pumping valve V6 and the second main pumping valve V7.

For example, the second slow pumping valve V6 may control the pumping until the second internal pressure PI of the reaction space 32 of the inner tube 30 reaches, for example, about 10 Torr, and the second main pumping valve V7 may control the pumping until the reaction space 32 of the inner tube 30 reaches a low pressure of about 10 Torr or less.

Also, the pumping applied to the inner vacuum pumping line 742, the second main pumping line 744, and the second slow pumping line 746 may depend on pumping force of the vacuum pump 750.

Also, the first high-pressure control valve OCV, the second high-pressure control valve ICV, and the vacuum pump 750 may be connected to a scrubber 800 through a scrubber line 802.

The scrubber 800 is configured to perform the exhaust for the first high-pressure control valve OCV, the second high-pressure control valve ICV, and the vacuum pump 750 and may be provided in the external exhaust device 793.

For the above-described operational relationship, the control part may check the pressure in the protective space 22 through the first pressure gauge and controls the exhaust of the protective space 22 through the first high-pressure control valve OCV according to a difference from a preset pressure value to control the pressure of the protective space 22.

Also, the control part may check the pressure in the reaction space 32 through the second pressure gauge and controls the exhaust of the reaction space 32 through the second high-pressure control valve ICV according to a difference from the preset pressure value to control the pressure of the reaction space 32.

The pressure of the protective space 22 may be always set higher than the pressure of the reaction space 32. Furthermore, the pressure of the protective space 22 may be set to be maintained in the same pressure difference as the reaction space 32.

In this case, the first pressure gauge may be omitted, and a constant pressure difference may be set based on the pressure of the reaction space 32 checked through the second pressure gauge to control the first high-pressure control valve OCV.

In the inner pumping part 740 and the outer pumping part 760 according to the present invention, which will be described later, a separate pressure gauge may also be installed in each of the inner vacuum pumping line 742 and the outer vacuum pumping line 762. Thus, the inner pumping part 740 and the outer pumping part 760 may be controlled based on pressure values measured by the pressure gauges.

For another example, the separate pressure gauges for the inner pumping part 740 and the outer pumping part 760 are omitted, and the pressure of the reaction space 32 may be controlled through a second pressure gauge provided in the second high-pressure control part 720. Thus, the first high-pressure control part 700, the inner pumping part 740, and the outer pumping part 760 may be controlled based on a value measured by the second pressure gauge.

The gas utility configured as described above may repeatedly perform the low-pressure process that is performed at a low pressure less than the atmospheric pressure after a period for which the second internal pressure PI of the reaction space 32 of the inner tube 30 is pressurized.

Here, in the gas utility, even when the second internal pressure PI of the reaction space 32 of the inner tube 30 is lower than the atmospheric pressure or maintained in the lowered state, the first internal pressure PO of the protective space 22 of the outer tube 20 may be controlled to be maintained at the atmospheric pressure.

Another embodiment of the gas utility according to the present invention will be described with reference to the accompanying drawings, and detailed descriptions of the same configuration as those of the first embodiment will be omitted.

Figure 9:
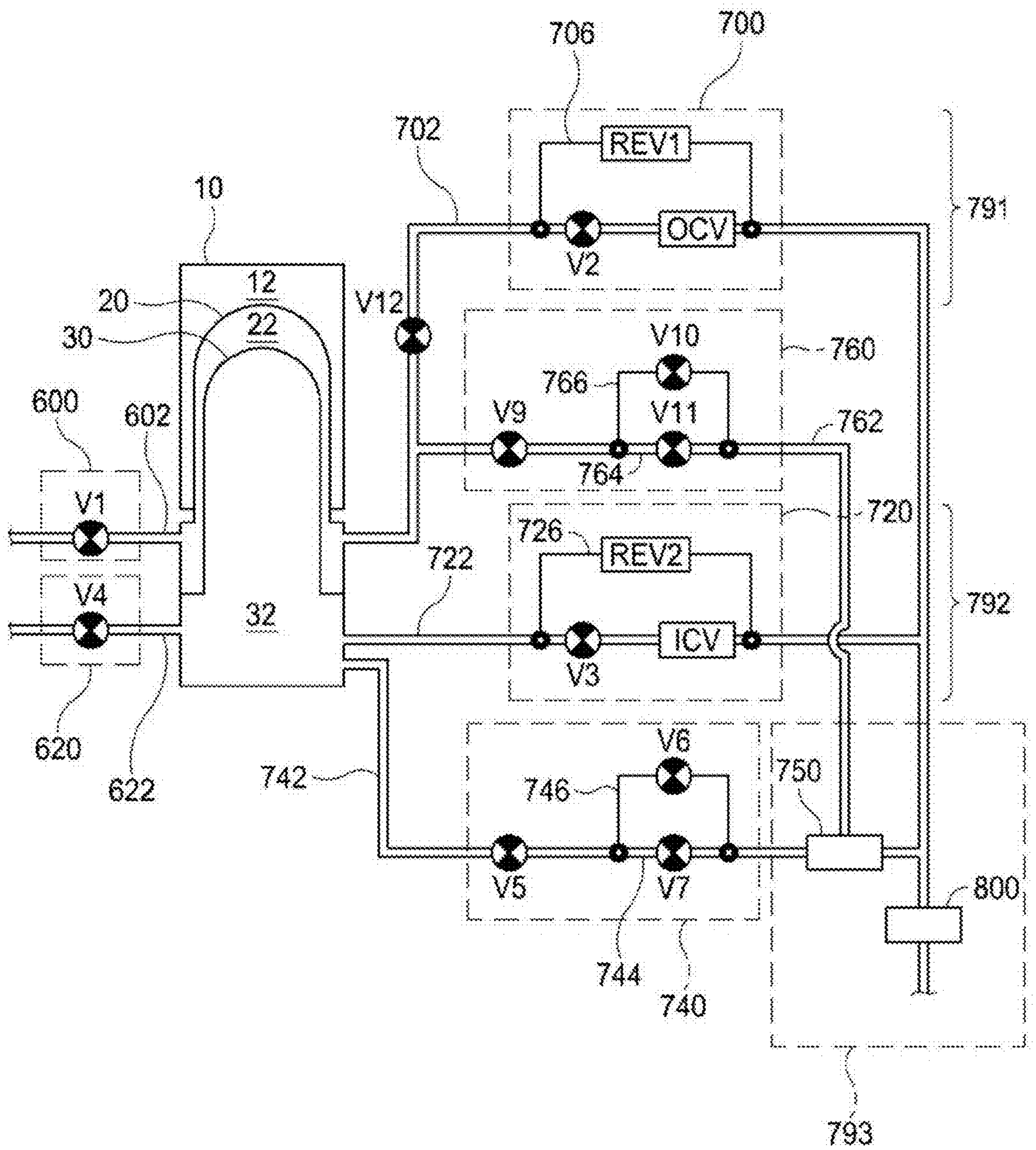
FIG. 9 is a system diagram illustrating a second embodiment of the gas utility of the substrate processing apparatus of FIG. 1.

As illustrated in FIG. 9, a gas utility according to a second embodiment may further include an outer pumping part 760 that is branched from a front end of a first high-pressure control part 700 to connect a vacuum pump 750 and performs pumping so that a protective space 22 is maintained at a pressure lower than atmospheric pressure and higher than a reaction space 32.

The outer pumping part 760 may be branched from a front end of the outer exhaust line 702 of the outer exhaust part 791, which is a side of the outer tube 30 of the first high-pressure control part 700, to connect the vacuum pump 750.

Thus, the outer pumping part 760 is configured to perform pump and exhaust so that the protective space 22 is maintained at a pressure lower than the atmospheric pressure and higher than the reaction space 32 and may be variously modified.

For example, the outer pumping part 760 may include an outer vacuum pumping line 762 connecting an outer exhaust part 791 to a vacuum pump 750 and a first low-pressure on/off valve V9 that is installed on the outer vacuum pumping line 762 to control a flow to the vacuum pump 750.

Also, the outer pumping part 760 may include a first main pumping valve V11 that is installed between the first low-pressure on/off valve V9 and the vacuum pump 750 to control a pressure in the protective space 22 so as to be maintained at a pressure lower than the atmospheric pressure and higher than the reaction space 32.

Also, the outer pumping part 760 includes a first valve V12 for inducing exhaust of an inert gas in the protective space 22 to be performed by one of the outer exhaust part 791 and the outer pumping part 760.

In this case, the vacuum pump 750 may be a vacuum pump to which the constitute of the inner pumping part 740 is connected. For another example, the inner pumping part may be provided with a separate vacuum pump, to which the outer pumping part 760 is connected, and thus be connected to a vacuum pump that is different from the inner pumping part 740.

The first low-pressure on/off valve V9 is installed on the outer vacuum pumping line 762 and may be opened to generate a low pressure in the protective space 22 of the outer tube 20.

Also, the first main pumping valve V11 is installed on a first main pumping line 764 connected to the outer vacuum pumping line 762 to control an amount of gas to be pumped through the outer vacuum pumping line 762.

Also, the first slow pumping valve V10 is installed on a first slow pumping line 766 in parallel with the first main pumping valve V11 to control an amount of gas to be pumped through the first slow pumping line 766.

Due to the configuration of the outer pumping part 760 described above, the pressure in the protective space 22 of the outer tube 20 may be depressurized by the pumping through the first slow pumping valve V10 and then may be depressurized again by the pumping through the first main pumping valve V11.

Here, the first low-pressure on/off valve V5 maintains an open state while pumping is performed by the first slow pumping valve V10 and the first main pumping valve V11.

For example, the first slow pumping valve V10 may control the pumping until the pressure of the protective space 22 of the outer tube 20 reaches, for example, about 10 Torr, and the first main pumping valve V11 may control the pumping until the protective space 22 of the outer tube 20 reaches a low pressure of about 10 Torr or less.

Also, the pumping applied to the outer vacuum pumping line 762, the first main pumping line 764, and the first slow pumping line 766 may depend on pumping force of the vacuum pump 750.

Also, in this case, an outer exhaust part 791 provided between the first high-pressure control part 700 and the outer vacuum pumping line 762 of the outer exhaust line 702 to exhaust an inert gas of the protective space 22 and a first valve V12 for inducing the exhaust of the inert gas in the protective space 22 to be performed by one of the outer exhaust part 791 and the outer pumping part 760.

As a result, in a state in which the first valve V12 is closed, the inert gas in the protective space 22 may be exhausted through the outer pumping part 760, and in a state in which the first valve V12 is opened, the inert gas in the protection space 22 may be exhausted through the outer exhaust unit 791 together with the closing of the first low-pressure on/off valve V9.

In a gas utility according to a second embodiment, when a second internal pressure PI, which is a pressure of a reaction space 32, is provided as a lower pressure less than atmospheric pressure, a first internal pressure PO may be maintained in a constant pressure difference ΔP in the same manner as when a second internal pressure PI is provided as a high pressure.

Particularly, in order to maintain the constant pressure difference ΔP, when the first internal pressure PO has to be greater than the second internal pressure PI and less than the atmospheric pressure, the first internal pressure PO is provided as a low pressure so that the constant pressure difference ΔP is maintained through the above-described configuration of the outer pumping unit 760.

Figure 10:
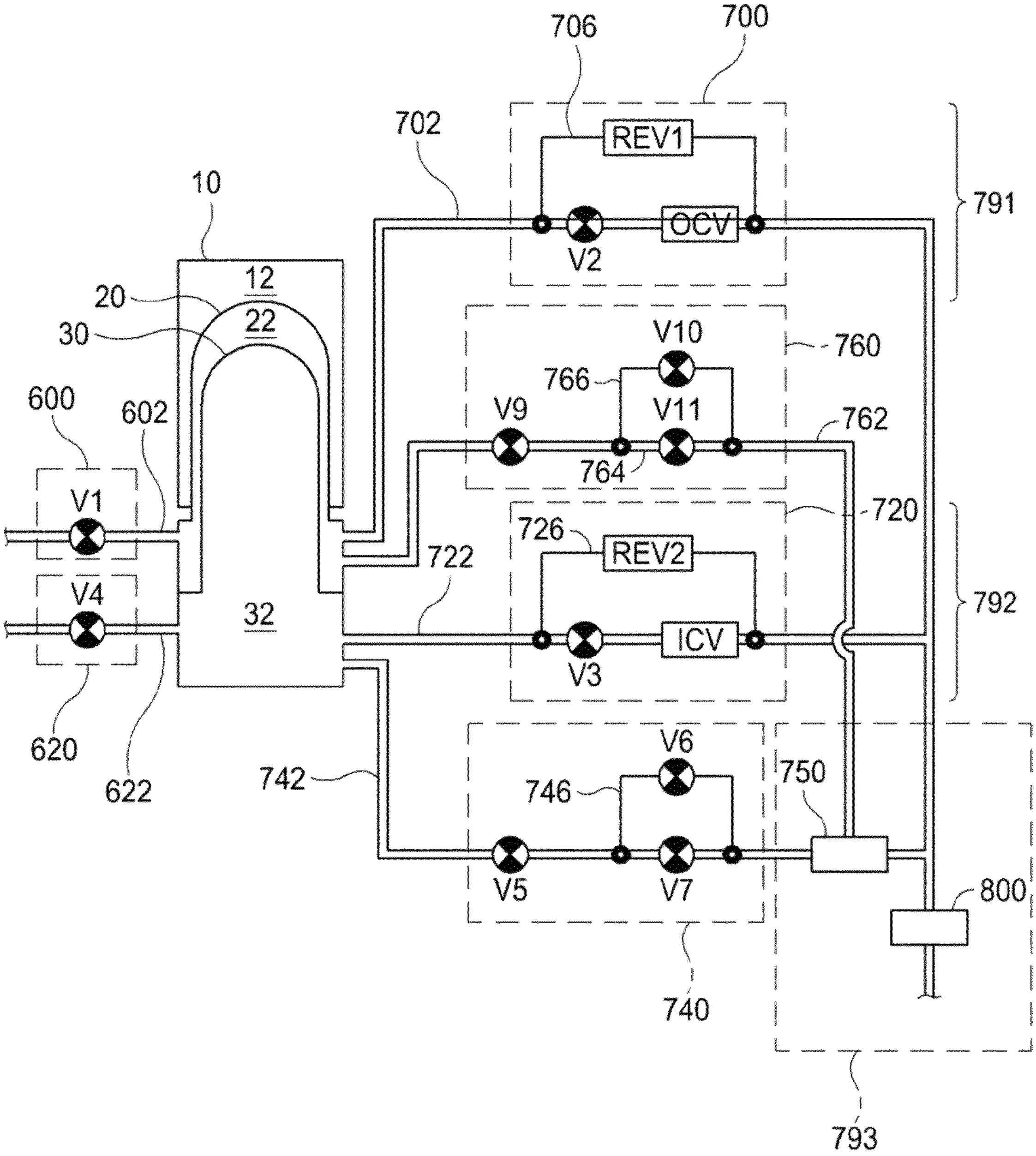
FIG. 10 is a system diagram illustrating a third embodiment of the gas utility of the substrate processing apparatus of FIG. 1.

As illustrated in FIG. 10, in a gas utility according to a third embodiment of the present invention, an outer pumping part 760 has one end connected to a separate outer pumping port provided on an outer manifold 50 and the other end connected to an exhaust device 793.

That is, the outer manifold 50 includes an outer pumping port for maintaining an internal pressure of a protective space 22 in a state of being lower than atmospheric pressure and higher than a pressure of a reaction space 32.

Here, the gas utility may connect the outer pumping port to a vacuum pump 750 and perform pumping so that the protective space 22 is maintained at a pressure lower than atmospheric pressure and higher than the reaction space 32.

Here, an outer vacuum pumping line 762 may connect the outer pumping port and the vacuum pump 750.

Figure 11:
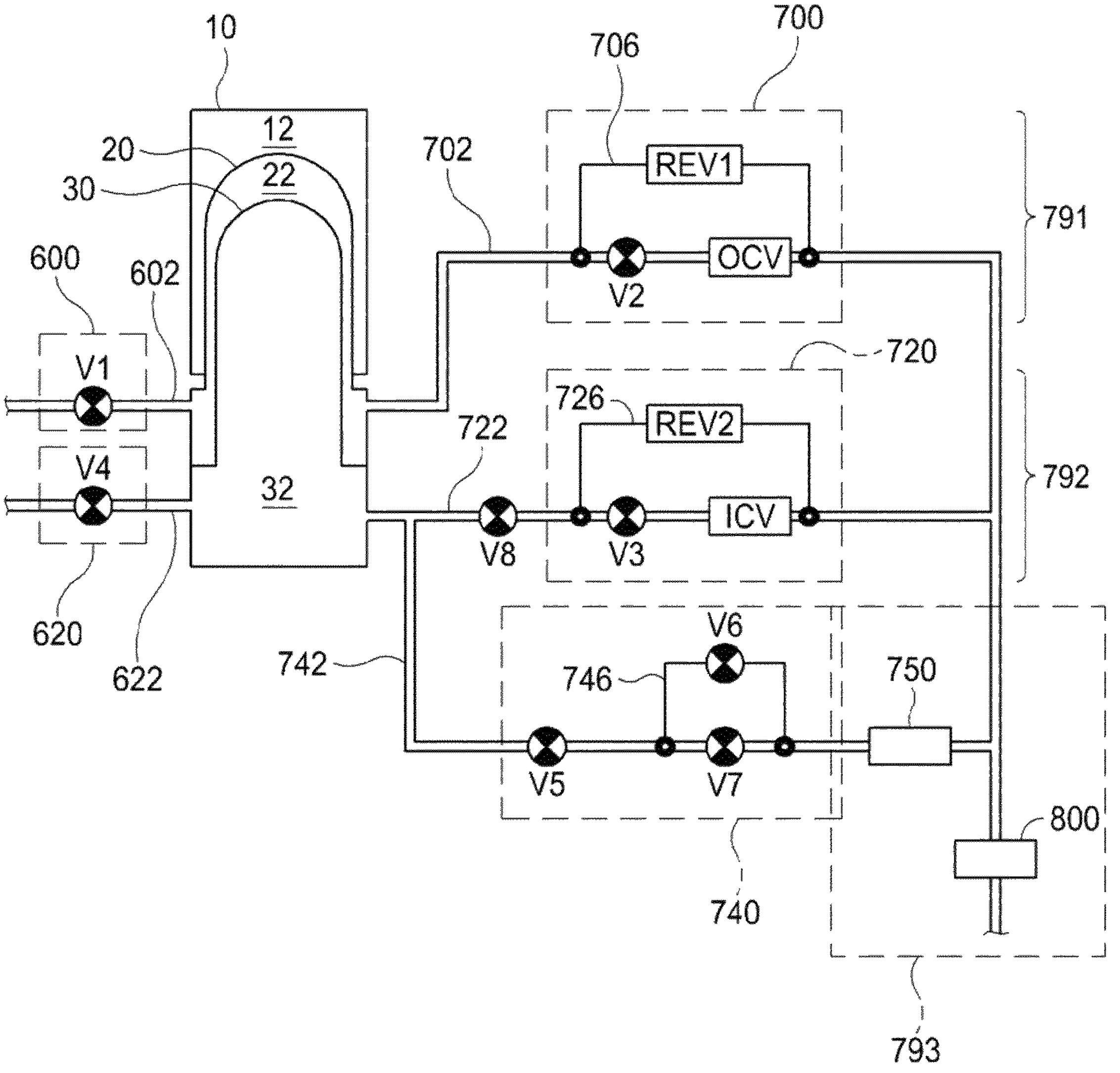
FIG. 11 is a system diagram illustrating a fourth embodiment of the gas utility of the substrate processing apparatus of FIG. 1.

As illustrated in FIG. 11, a gas utility according to a fourth embodiment of the present invention may include an inner pumping part 740 which is branched from a front end of a second high-pressure valve part 720 in an inner exhaust line 722 of an inner exhaust part 792 to connect a vacuum pump 750 connected to an external exhaust device 793 and performs pumping so that a reaction space 32 has a pressure less than atmospheric pressure.

That is, the inner pumping part 740 is branched from a front end of the second high pressure valve part 720 in the inner exhaust line 722 of the inner exhaust part 792 and is connected to the external exhaust device 793 to perform a low pressure exhaust in the reaction space 32 at a pressure less than atmospheric pressure.

In this case, in the inner pumping part 740, an inner vacuum pumping line 742 may be branched from the inner exhaust line 722 of the inner exhaust part 792, and the other end of each of the second main pumping line 744 and the second slow pumping line 746, which are described above, is disposed to be connected to an external exhaust device 793, i.e., a vacuum pump 750.

Here, the above-described constituents of the outer pumping part 760 may be omitted, and the pressure of the protective space 22 may be maintained at atmospheric pressure or a pressure higher than the atmospheric pressure so that the pressure of the protective space 22 has a deviation with respect to the pressure of the reaction space 32.

Also, in this case, a second valve V8 provided in the inner exhaust line 722 between second high-pressure control part 720 and the inner vacuum pumping line 742 to induce the exhaust of a process gas of the reaction space 32 by selectively using one of the inner exhaust part 792 and the inner pumping part 740.

That is, when the second valve V8 is closed, the process gas in the reaction space 32 may be exhausted through the inner pumping part 740.

In this case, when the second valve V8 is opened, the process gas in the reaction space 32 may be exhausted through the inner exhaust part 792 together with the closing of the second low pressure control valve V5.

Figure 12:
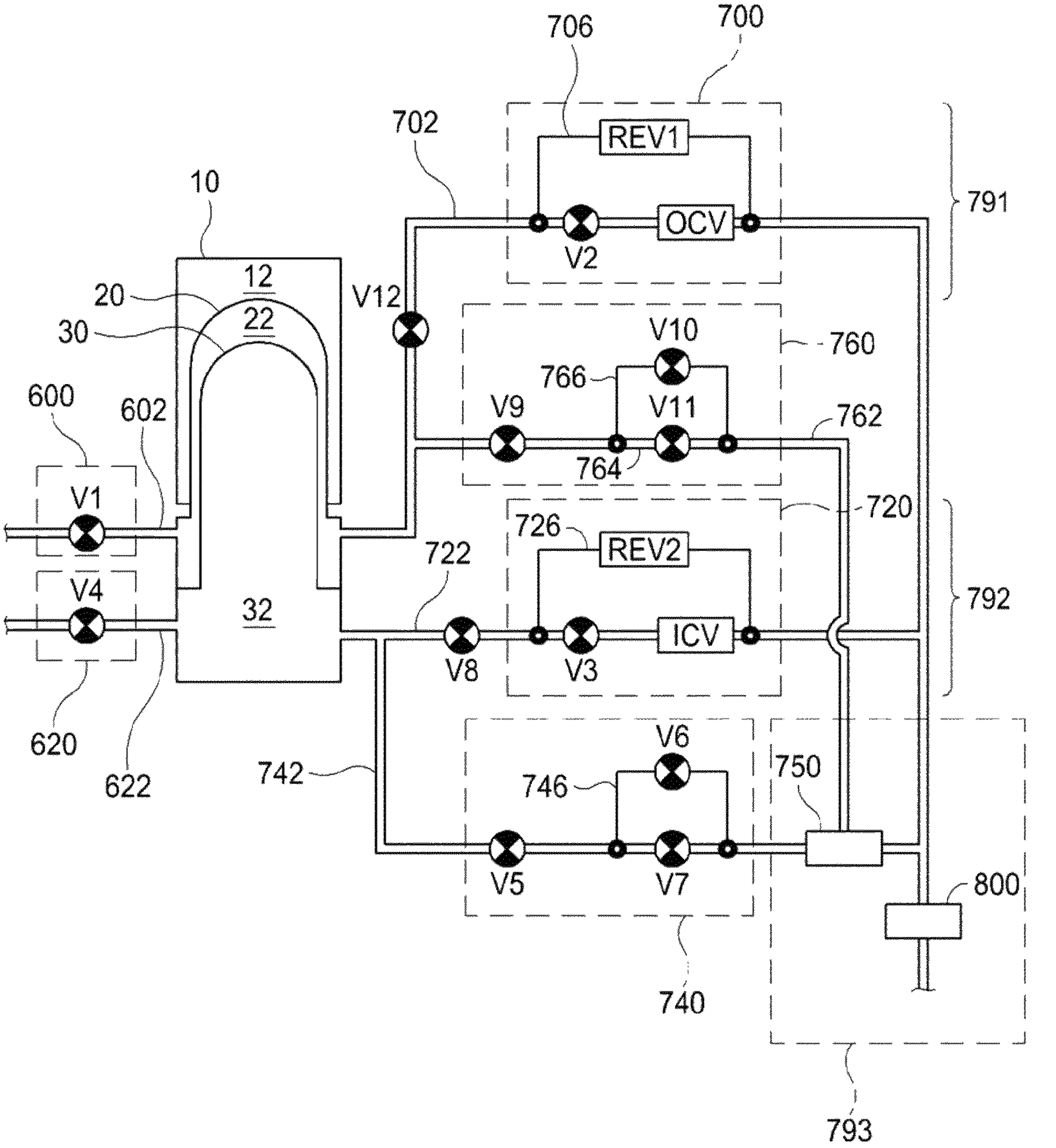
FIG. 12 is a system diagram illustrating a fifth embodiment of the gas utility of the substrate processing apparatus of FIG. 1.

Also, as illustrated in FIG. 12, in a gas utility according to a fifth embodiment, like the fourth embodiment, in a state in which an inner pumping part 740 is provided, an outer pumping part 760 may be branched from a front end of a first high-pressure control part 700 in the outer exhaust line 702 of the outer exhaust part 791 and be connected to an external exhaust device 793.

As a result, the pumping may be performed in the protective space 22 to maintain a low pressure state below atmospheric pressure.

In this case, in the outer pumping part 760, an outer vacuum pumping line 762 may be branched from a front end of the first high-pressure control part 700 in the outer exhaust line 702 of the outer exhaust part 791. Thus, the other end of each of the first main pumping line 764 and the first slow pumping line 766, which described above, may be disposed to be connected to the external exhaust device 793, i.e., a vacuum pump 750.

Figure 13:
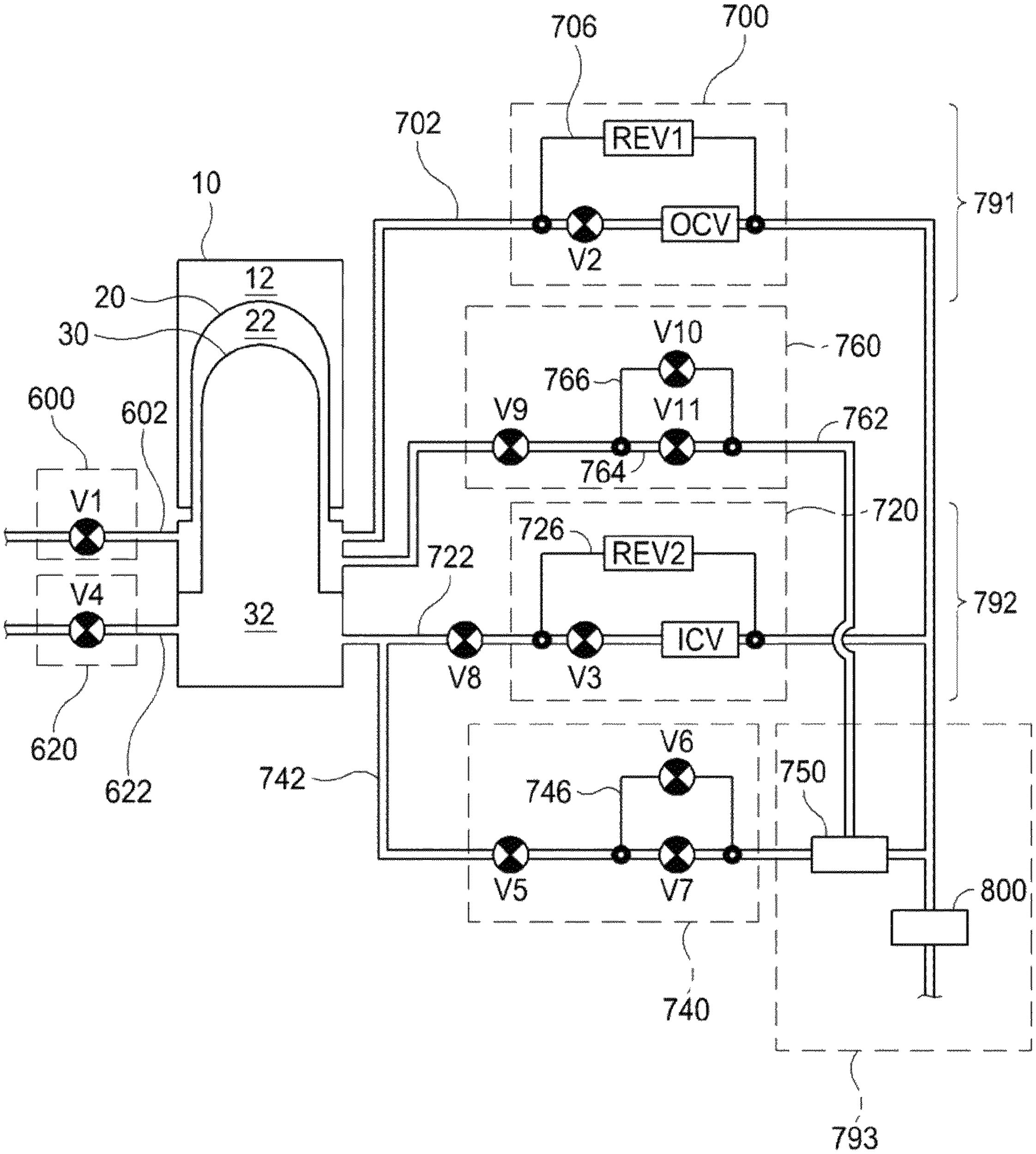
FIG. 13 is a system diagram illustrating a sixth embodiment of the gas utility of the substrate processing apparatus of FIG. 1.

For another example, as illustrated in FIG. 13, in a gas utility according to a sixth embodiment, an outer pumping part 760 has one end connected to a separate outer pumping port provided on an outer manifold 50 and the other end connected to an exhaust device 793.

That is, the outer manifold 50 includes an outer pumping port for maintaining an internal pressure of a protective space 22 at a state of being lower than atmospheric pressure and higher than a pressure of a reaction space 32. Also, in the gas utility, an outer pumping port and a vacuum pump 750 may be connected to each other to perform pumping so that the protective space 22 is maintained at a pressure lower than the atmospheric pressure and higher than that of the reaction space 32.

Here, an outer vacuum pumping line 762 may connect the outer pumping port and the vacuum pump 750.

Figure 14:
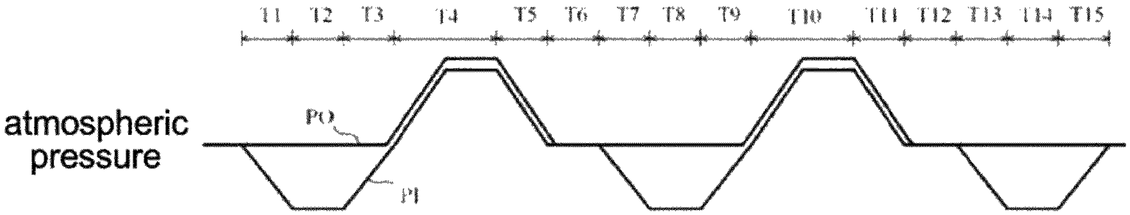
FIG. 14 is a waveform diagram for explaining an embodiment of an operation through the gas utility of the substrate processing apparatus of FIG. 1.
Figure 15:
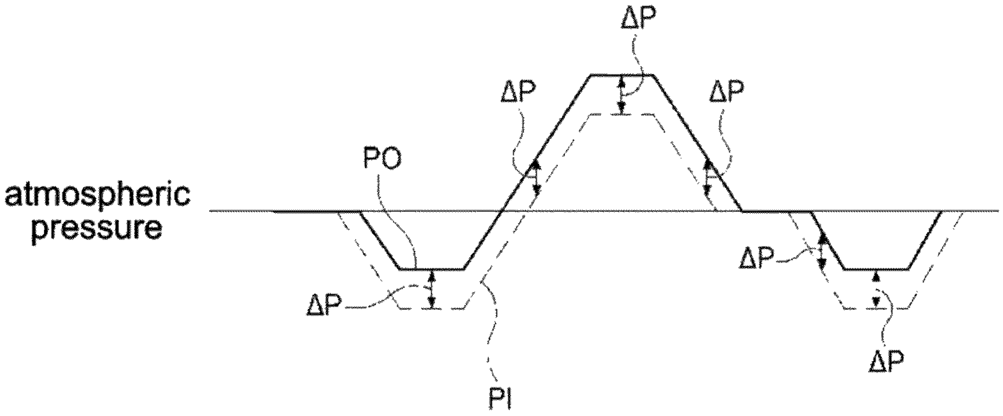
FIG. 15 is a waveform diagram for explaining another embodiment of the operation through the gas utility of the substrate processing apparatus of FIG. 1.

Referring to FIGS. 14 and 15, a method of controlling a pressure of each of a reaction space 32 and a protective space 22 for each period will be described with reference to FIGS. 14 and 15.

For reference, the term 'pressurization' used throughout this specification of the present invention refers to a case in which a pressure increases higher than that in the previous process, and the term 'depressurization' is used in the opposite sense.

Also, the meaning of the terms 'high pressure' and 'low pressure' indicates a pressure higher than atmospheric pressure and a pressure lower than atmospheric pressure, respectively, even if not described separately.

Hereinafter, a pressure control method described with reference to FIG. 14 will be described through the first embodiment of FIG. 8, which is a representative gas utility, but may be applied through the gas utilities of the second to sixth embodiments of FIGS. 9 to 13.

A period T1 and a period T2 for preprocessing are periods for preparing a leak check and pressurization process.

In the period T1 and the period T2, supply of a process gas through a second gas supply part 620 to a reaction space 32 of an inner tube 30 and exhaust of the process gas through a second high-pressure control part 720 are not performed.

In this case, in order to maintain the atmospheric pressure with respect to a protective space 22 of an outer tube 20, supply of an inert gas through a first gas supply part 600 and exhaust of the inert gas through the first high-pressure control part 700 are controlled.

Also, in the period T1, an inner pumping part 740 opens a low pressure on/off valve V5, closes a main pumping valve V7, and opens a slow pumping valve V6.

That is, slow pumping for the reaction space 32 of the inner tube 30 is performed.

In the period T2, an inner pumping part 740 maintains the opening of the low-pressure on/off valve V5, opens the main pumping valve V7, and closes the slow pumping valve V6.

That is, main pumping for the reaction space 32 of the inner tube 30 is performed.

A second internal pressure PI of the reaction space 32 of the inner tube 30 is depressurized to a pressure less than the atmospheric pressure by the slow pumping for the period T1, and the depressurized pressure is maintained by the main pumping for the period T2.

When the reaction space 32 of the inner tube 30 is sealed by a cap flange 70, and the reaction space 32 of the inner tube 30 has a low pressure while passing for the period T1 and the period T2, whether leak occurs may be checked in the reaction space 32 of the inner tube 30.

Also, the clamping module 300 may perform clamping by close contact between the cap flange 70 and a second lower flange 63 of an inner manifold 60 due to the low pressure in the reaction space 32 for the period T2.

After performing the preprocessing as described above, the gas utility may equally perform a process as for the period T3 to the period T7 of FIG. 14.

FIG. 14 illustrates that two processes are repeated, and since the processes for the periods T3 to T7 are the same as for the periods T9 to T13, its duplicated description is omitted.

If a low pressure needs to be maintained even while the process is repeated twice in succession, it may be performed as illustrated as for the period T8.

In the periods T3 to T6, the pumping of the inner pumping part 740 with respect to the reaction space 32 of the inner tube 30 is stopped.

In the period T3, in order to maintain the atmospheric pressure of the protective space 22 of the outer tube 20, the supply of the inert gas through the first gas supply part 600 and the exhaust of the inert gas through the first high-pressure control part 700 are controlled.

Also, the second gas supply part 620 performs the supply of the process gas so that a second internal pressure PI of the reaction space 32 of the inner tube 30 increases to the atmospheric pressure, and the second high-pressure control part 720 does not perform the exhaust.

Here, the process gas supplied to the inner tube 30 may use hydrogen.

In the period T4, each of the protective space 22 of the outer tube 20 and the reaction space 32 of the inner tube 30 has a first internal pressure PO and a second internal pressure PI, which are higher than the atmospheric pressure. The first internal pressure PO is maintained at a higher pressure having a constant difference than the second internal pressure PI.

In the period T4, in order that the protective space 22 of the outer tube 20 has the atmospheric pressure, the supply of the inert gas through the first gas supply part 600 and the exhaust of the inert gas through the first high-pressure control part 700 are controlled.

Here, in order to pressurize the protective space 22 of the outer tube 20, the first gas supply part 600 supplies the inert gas in excess of the exhaust amount.

Also, in order that the reaction space 32 of the inner tube 30 has a high pressure higher than the atmospheric pressure, the supply of the process gas through the second gas supply part 620 and the exhaust of the second high-pressure control part 720 are controlled.

Here, in order to pressurize the reaction space 32 of the inner tube 30, the second gas supply part 620 supplies the process gas in an amount greater than or equal to the exhaust amount.

For example, the process gas supplied to the inner tube 30 may use hydrogen.

Thereafter, the protective space 22 of the outer tube 20 and the reaction space 32 of the inner tube 30 are maintained at a high pressure having a constant difference between the first internal pressure PO and the second internal pressure PI.

In order to maintain the high pressure difference, the supply of the inert gas through the first gas supply part 600 and the exhaust of the inert gas through the first high-pressure control part 700 are maintained, and the supply of the process gas and the exhaust of the second high-pressure control part 720 are maintained.

Here, the supply and exhaust of the inert gas to the protective space 22 and the supply and exhaust of the process gas to the reaction space 32 are respectively controlled to be maintained at the high pressure.

Thereafter, in the period T5, the exhaust through the first high-pressure control part 700 with respect to the protective space 22 of the outer tube 20 and the exhaust through the second high-pressure control part 720 with respect to the reaction space 32 of the inner tube 30 are performed until the outer tube 20 and the inner tube 30 reach the atmospheric pressure.

In this case, the supply of the inert gas through the first gas supply part 600 and the supply of the process gas through the second gas supply part 620 may be maintained in a small amount or be blocked for purging.

Thereafter, in the period T6, the supply of the inert gas through the first gas supply part 600 and the exhaust of the inert gas through the first high-pressure control part 700 are controlled to maintain the atmospheric pressure with respect to the protective space 22 of the outer tube 20.

Also, the supply of the process gas through the second gas supply part 620 and the exhaust of the process gas through the second high-pressure control part 720 are also controlled to maintain the atmospheric pressure to the reaction space 32 of the inner tube 30.

Here, the process gas supplied to the inner tube 30 may use nitrogen to dilute hydrogen.

Thereafter, in the period T7, like in the period T1, the atmospheric pressure in the protective space 22 of the outer tube 20 is maintained, the slow pumping of the reaction space 32 of the inner tube 30 is performed, and during the period T8, the low pressure is maintained.

Since the operation is performed for the period T7 in the same manner as for the period T1, duplicated description thereof will be omitted.

According to an embodiment of the present invention, in the period T3 to T7 or the period T9 to T13 of FIG. 14, the pressurization and the depressurization are performed, i.e., a pressure change process may be performed.

Therefore, an embodiment of the present invention may be improved in characteristic of the thin film by allowing the reaction space to have the high pressure even before forming the thin film, during the formation of the thin film, or after forming of the thin film and then to have again the low pressure.

That is, in this embodiment, when a low-pressure process is performed on the outer exhaust part 791 in the reaction space 32 by driving the inner pumping part 740, the pressure in the protective space 22 is maintained at the atmospheric pressure or higher than the atmospheric pressure. Thus, the protective space may be exhausted to be maintained at the pressure higher than the atmospheric pressure.

Here, the first high-pressure control valve 700 may control the exhaust of the outer exhaust line 702 so as to be maintained at a pressure higher than that of the inner exhaust line 722 by a uniform difference based on the pressure of the inner exhaust line 722.

Also, according to an embodiment of the present invention, like the period T14 for performing post-processing after the completion of the above process, the post-processing may be performed at a low-pressure state so that the second internal pressure PI of the reaction space 32 of the inner tube 30 has a lower pressure than the atmospheric pressure.

In the above post-processing period, according to an embodiment of the present invention, the leak check and the clamping between the cap flange 70 and the inner manifold 60 may be released.

The present invention may implement the substrate processing apparatus that performs the pressure change process of depressurizing the pressure after the pressurization so as to improve the characteristics of the thin film according to the above-described embodiment.

Also, according to an embodiment of the present invention, damage of the inner tube 30 that may occur in the above-described pressure change process may be prevented, and leakage may be prevented to secure reliability of the substrate processing apparatus, thereby improving various effects such as process efficiency and process yield.

Also, in the pressure control method according to another embodiment of the present invention, as illustrated in FIG. 15, when the low pressure process is performed in the reaction space 32, the pumping may be performed so that the first internal pressure PO of the protective space 22 is higher than the internal pressure PI and lower than the atmospheric pressure.

Since the pressure control method includes a case in which the first internal pressure PO of the protective space 22 is in a low pressure state lower than the atmospheric pressure, the pressure control method may be implemented through the gas utilities according to the foregoing second, third, fifth, and sixth embodiments, which are illustrated in FIGS. 9, 10, 12, and 13.

In this process, the second internal pressure PI may be maintained in a constant pressure difference ΔP rather than the first internal pressure PO.

The case in which the reaction space 32 has the high pressure is the same as in the above-described embodiment, and thus only differences will be described below, and the pressure control method of FIG. 14 may be applied equally to the omitted description.

Also, when the low pressure process is performed in the reaction space 32 by driving the inner pumping part 740, the outer pumping part 760 may perform the pumping that the pressure of the protective space 31 is maintained lower than the atmospheric pressure and higher than that of the reaction space 32.

Here, the first main pumping valve 11 may control the pumping of the outer pumping line 762 so as to be maintained at a pressure higher than that of the inner pumping line 742 by a uniform difference based on the pressure of the inner pumping line 742.

That is, as illustrated in FIG. 15, in each of the foregoing embodiments of the present invention, when the pressure of the reaction space 32 is controlled to the high or low pressure through the inner exhaust part 792 and the inner pumping part 740, the pressure of the protective space 22 through the outer exhaust part 791 and the outer pumping part 760 may be maintained throughout the entire process so that the pressure of the reaction space 32 is greater than the pressure of the reaction space 32 while maintaining the constant pressure difference ΔP.

In the substrate processing apparatus according to the present invention, the reaction space may be pressurized to the appropriate atmosphere and then depressurized after before, while, or after the thin film is formed. Therefore, the properties of the thin film may be improved.

In addition, the substrate processing apparatus according to the present invention may have the double tube structure of the inner tube and the outer tube. Therefore, the inner tube may be prevented from being directly exposed to the external environment by the outer tube to prevent the inner tube from being damaged by the environmental difference between the external environment and the reaction space inside the inner tube.

In addition, in the substrate processing apparatus according to the present invention, the pressure of the protective space of the outer tube may be maintained equal to or higher than that of the reaction space of the inner tube during the process of processing the substrate. Therefore, when the inner tube is damaged due to the unspecified reasons, the particles or the like may be prevented from being diffused to the outside of the outer tube by the high pressure of the protective pace of the outer tube.

In addition, in the substrate processing apparatus according to the present invention, the damage due to the inner tube may be prevented, and the content of the damage due to the inner tube may be limited to the inside of the outer tube to secure the reliability and improve the process yield.

In addition, in the substrate processing apparatus according to the present invention, the inner tube and the outer tube may be provided to provide the dome-shaped ceiling. Therefore, the pressure may be uniformly distributed above the inner tube and the outer tube to secure the structural stability. In addition, there may be the advantage of preventing the vortex from being generated in the inner tube or preventing the air current from being partially stagnated. As a result, there may be the advantage of securing the product reliability and improving the process efficiency and the process yield.

In addition, in the substrate processing apparatus according to the present invention, the inner manifold and the outer manifold may be provided on the outer portions of the inner tube and the outer tube, respectively. Therefore, the substrate processing apparatus according to the present invention may independently supply and exhaust the gas with respect to the inner tube and the outer tube. In addition, the gas supply and exhaust structures may be respectively concentrated to the lower portions of the inner tube and the outer tube to secure the convenience of the design and assembly.

In addition, in the substrate processing apparatus according to the present invention, the spaced interval between the inner manifold and the cap flange may decrease by the depressurization of the reaction space, and then, the inner manifold and the cap flange may be clamped with each other. As a result, the substrate processing apparatus according to the present invention may have the advantage of preventing the leakage from occurring between the inner manifold and the cap flange by the high pressure during the process of processing the substrate.

In addition, in the substrate processing apparatus according to the present invention, the reaction space may be formed using the vertical cylindrical inner tube having the dome-shaped ceiling, and the temperature may be sensed at the plurality of temperature sensing positions in the reaction space, which includes the lower portion of the dome-shaped ceiling. Therefore, the temperature of the entire reaction space may be sensed by the inner tube having the dome-shaped ceiling, and the heating of the entire reaction space for the substrate processing may be uniformly controlled.

In addition, the substrate processing apparatus according to the present invention, the gas may be independently supplied and exhausted with respect to the reaction space and the protective space so that the pressure of the protective space of the outer tube is maintained equal to or higher than that of the reaction space of the inner tube during the process of processing the substrate.

Although the above description merely corresponds to some exemplary embodiments that may be implemented by the present invention, as well known, the scope of the present invention should not be interpreted as being limited to the above-described embodiments, and all technical spirits having the same basis as that of the above-described technical spirit of the present invention are included in the scope of the present invention.

What is claimed is:

1. A substrate processing apparatus comprising:
- an outer tube that defines a protective space;
- an inner tube that defines a reaction space, wherein a first portion of the inner tube is accommodated within the outer tube, and a second portion of the inner tube protrudes downward from the outer tube, wherein a high-pressure process is carried out in the reaction space under a pressure higher than atmospheric pressure;
- a manifold assembly configured to support the outer tube and the inner tube in a state in which the outer tube and the inner tube are spaced apart from each other;
- a cap flange configured to seal a lower portion of the manifold assembly;
- a base plate spaced apart from a lower portion of the cap flange; and
- a plurality of actuators distributed at one of a plurality of positions on the base plate, each actuator fixed to the base plate and configured to move a clamp between a releasing position and a locked position, wherein the clamp includes a clamping channel facing a side surface of the cap flange and is configured to clamp the cap flange and a flange of the manifold assembly inside the clamping channel, a clamp bracket configured to vertically support the clamp.

2. The substrate processing apparatus of claim 1, wherein the outer tube is made of a metal material, and the inner tube is made of a non-metal material.

3. The substrate processing apparatus of claim 1, wherein the outer tube and the inner tube are made of a non-metal material.

4. The substrate processing apparatus of claim 1, wherein the outer tube has a vertical cylindrical shape with a first dome-shaped ceiling, and
- the inner tube has a vertical cylindrical shape with a second dome-shaped ceiling.

5. The substrate processing apparatus of claim 1, wherein the manifold assembly comprises:
- an outer manifold configured to support a lower end of the outer tube and define a first inner space connected to the protective space; and
- an inner manifold coupled to a lower portion of the outer manifold to support a lower end of the inner tube and defining a second inner space connected to the reaction space.

6. The substrate processing apparatus of claim 5, wherein the outer manifold comprises:
- a first sidewall defining the first inner space;
- a first upper flange extending outward from a circumference of an upper portion of the first sidewall to support the lower end of the outer tube; and
- a first lower flange extending outward from a circumference of a lower portion of the first sidewall and coupled to the inner manifold, the first lower flange provided with a plurality of coupling parts on which coupling members are coupled along the circumference, wherein the inner manifold comprises:

a second sidewall defining the second inner space;

a second upper flange extending outward from a circumference of an upper portion of the second sidewall and coupled to the outer manifold, the second upper flange provided with a plurality of second coupling parts on which the coupling members are coupled along the circumference;

a second lower flange extending outward from a circumference of a lower portion of the second sidewall, wherein the first lower flange and the second upper flange are coupled to each other by the coupling members.

7. The substrate processing apparatus of claim 6, wherein the first sidewall of the outer manifold has an inner diameter greater than that of the second sidewall of the inner manifold.

8. The substrate processing apparatus of claim 5, wherein the outer manifold is provided with an outer gas supply port through which an inert gas is supplied and an outer gas exhaust port through which the inert gas is exhausted.

9. The substrate processing apparatus of claim 8, wherein the outer manifold is provided with an outer pumping port connected to an external vacuum pump such that the protective space has a low pressure lower than atmospheric pressure.

10. The substrate processing apparatus of claim 5, wherein the inner manifold is provided with an inner gas supply port configured to supply a process gas and an inner gas exhaust port configured to exhaust the process gas.

11. The substrate processing apparatus of claim 10, wherein the inner manifold is provided with an inner pumping port connected to an external vacuum pump such that the reaction space has a low pressure lower than atmospheric pressure.

12. The substrate processing apparatus of claim 6, wherein, in the inner manifold, a thermocouple coupler to which a thermocouple protection tube, in which a thermocouple configured to measure a temperature of the reaction space is installed, is coupled is disposed on the second sidewall.

13. The substrate processing apparatus of claim 1, further comprising:

an inner pumping part configured to perform pumping with respect to the reaction space through the manifold assembly, wherein a top surface of the cap flange is spaced apart from a bottom surface of the manifold assembly by a first spaced interval with an O-ring therebetween by elevation of the cap flange, wherein as the reaction space transitions from a pressure equal to or greater than atmospheric pressure to a pressure less than atmospheric pressure by pumping of the inner pumping part, the cap flange is elevated due to pressure change and transitions from the first spaced interval to a second spaced interval, such that the top surface of the cap flange is spaced apart from the bottom surface of the manifold assembly by the second spaced interval less than the first spaced interval with the O-ring therebetween, and the plurality of clamps are configured to clamp the cap flange adjacent to the second spaced interval with the flange of the manifold assembly.

14. The substrate processing apparatus of claim 13, further comprising a base plate spaced apart from the lower portion of the cap flange, wherein, as the clamps are moved by the actuators, the cap flange adjacent to the second spaced interval and the flange of the manifold assembly are clamped inside the clamping channel.

15. The substrate processing apparatus of claim 1, wherein each actuator is configured to move the clamp in a radial direction between a releasing position and a locked position.

16. The substrate processing apparatus of claim 14, further comprising an elevating plate, which is maintained to be spaced apart from the base plate by elastic force of an elastic part, under the base plate, wherein the elastic part is disposed between the base plate and the elevating plate and provides the elastic force such that a top surface of the cap flange and a bottom surface of the manifold assembly are close by the first spaced interval.

17. The substrate processing apparatus of claim 16, wherein the elastic part comprises a spring disposed at a plurality of positions between the elevating plate and the base plate.

18. The substrate processing apparatus of claim 13, wherein the manifold assembly comprises:

an outer manifold configured to support a lower portion of the outer tube and define a first inner space connected to the protective space; and an inner manifold configured to support a lower portion of the inner tube and define a second inner space connected to the reaction space, wherein the inner manifold comprises the flange constituting a portion of the manifold assembly and facing a top surface of a side portion of the cap flange, and the plurality of clamps is configured to clamp the cap flange and the flange, which are adjacent to each other by the second spaced interval through the O-ring.

19. The substrate processing apparatus of claim 5, further comprising a thermocouple protection tube installed vertically in the reaction space, of which a lower portion is drawn out through the inner manifold, and into which a plurality of thermocouples comprising detection parts configured to sense temperatures at different positions within the reaction space are inserted, wherein the reaction space is divided into a ceiling region defined by the second dome-shaped ceiling and a reaction region defined under the ceiling region, the thermocouple protection tube comprises an extension tube extending to the ceiling region and having a bent upper portion, and the detection part of at least one thermocouple is disposed inside the extension tube.

20. The substrate processing apparatus of claim 19, wherein the thermocouple protection tube comprises the extension tube disposed at an upper side, a vertical tube disposed under the extension tube, and a lower tube bent from the vertical tube to pass through a sidewall of the inner manifold to be drawn to the outside, and the extension tube, the vertical tube, and the lower tube are integrated with each other.

21. The substrate processing apparatus of claim 1, wherein the clamping channel faces a side surface of the cap flange such that the cap flange is clamped inside the clamping channel in the locked position.

22. The substrate processing apparatus of claim 1, wherein the plurality of clamps are configured to clamp the cap flange and the flange of the manifold assembly during a high-pressure process.

23. The substrate processing apparatus of claim 1, wherein the plurality of clamps is dispersed on a side surface of the cap flange.

24. The substrate processing apparatus of claim 1, wherein each actuator drives a rod to move the clamp and a clamp bracket that supports the clamp.

* * * * *